United States Patent
Guillou et al.

(10) Patent No.: US 11,619,779 B1
(45) Date of Patent: Apr. 4, 2023

(54) METHODS FOR FORMING IMAGE TRANSPORT LAYERS

(71) Applicant: Apple Inc., Cupertino, CA (US)

(72) Inventors: Jean-Pierre S. Guillou, Los Gatos, CA (US); Tyler R. Kakuda, Stockton, CA (US); Ying-Chih Wang, Sunnyvale, CA (US); Michael J. Brown, Campbell, CA (US); Yi Qiao, San Jose, CA (US); Hao Dong, Santa Clara, CA (US); Paul C. Kelley, San Francisco, CA (US); Shaorui Yang, Milpitas, CA (US); Salman Karbasivalashani, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 337 days.

(21) Appl. No.: 16/536,733

(22) Filed: Aug. 9, 2019

Related U.S. Application Data

(60) Provisional application No. 62/760,754, filed on Nov. 13, 2018, provisional application No. 62/717,626, filed on Aug. 10, 2018.

(51) Int. Cl.
*G02B 6/08* (2006.01)
*H01L 51/52* (2006.01)

(52) U.S. Cl.
CPC ............ *G02B 6/08* (2013.01); *H01L 51/5275* (2013.01)

(58) Field of Classification Search
None
See application file for complete search history.

(56) References Cited

U.S. PATENT DOCUMENTS

| | | | |
|---|---|---|---|
| 28,341 | A | 5/1860 | Bennett |
| 4,349,817 | A | 9/1982 | Hoffman et al. |
| 4,534,813 | A | 8/1985 | Williamson et al. |
| 5,329,386 | A | 7/1994 | Birecki et al. |
| 5,465,315 | A * | 11/1995 | Sakai ............ G09F 9/305 385/116 |
| 5,502,457 | A | 3/1996 | Sakai et al. |
| 5,659,378 | A | 8/1997 | Gessel |
| 6,046,730 | A | 4/2000 | Bowen et al. |
| 6,407,785 | B1 | 6/2002 | Yamazaki |
| 6,467,922 | B1 | 10/2002 | Blanc et al. |
| 6,680,761 | B1 | 1/2004 | Greene et al. |
| 6,845,190 | B1 | 1/2005 | Smithwick et al. |

(Continued)

FOREIGN PATENT DOCUMENTS

KR 20180034832 A 4/2018

*Primary Examiner* — Chad H Smith
(74) *Attorney, Agent, or Firm* — Treyz Law Group, P.C.; Joseph F. Guihan; David K. Cole

(57) ABSTRACT

An electronic device may have a display with pixels configured to display an image. An image transport layer may be formed from a coherent fiber bundle or Anderson localization material. The image transport layer may overlap the pixels and may have an input surface that receives the image from the pixels and a corresponding output surface on which the received image is viewable. The image transport layer may form an exterior surface of the electronic device or may be overlapped by a transparent cover layer. Various methods such as swelling, piping, and slumping may be used to process fibers and form image transport layers. A fiber bundle that is used to form an image transport layer may include fibers that have varying properties.

13 Claims, 26 Drawing Sheets

(56) References Cited

U.S. PATENT DOCUMENTS

| | | |
|---|---|---|
| 7,228,051 B2 | 6/2007 | Cok et al. |
| 7,542,209 B2 | 6/2009 | McGuire, Jr. |
| 7,823,309 B2 | 11/2010 | Albenda |
| 7,856,161 B2 | 12/2010 | Tabor |
| 8,045,270 B2 | 10/2011 | Shin et al. |
| 8,723,824 B2 | 5/2014 | Myers et al. |
| 8,824,779 B1 | 9/2014 | Smyth |
| 8,976,324 B2 | 3/2015 | Yang et al. |
| 9,268,068 B2 | 2/2016 | Lee |
| 9,312,517 B2 | 4/2016 | Drzaic et al. |
| 9,342,105 B2 | 5/2016 | Choi et al. |
| 9,509,939 B2 | 11/2016 | Henion et al. |
| 9,591,765 B2 | 3/2017 | Kim et al. |
| 9,755,004 B2 | 9/2017 | Shieh et al. |
| 9,818,725 B2 | 11/2017 | Bower et al. |
| 9,907,193 B2 | 2/2018 | Lee et al. |
| 10,048,532 B2 | 8/2018 | Powell et al. |
| 10,052,831 B2 | 8/2018 | Welker et al. |
| 2006/0016448 A1 | 1/2006 | Ho |
| 2007/0097108 A1 | 5/2007 | Brewer |
| 2008/0144174 A1 | 6/2008 | Lucente et al. |
| 2008/0186252 A1 | 8/2008 | Li |
| 2010/0177261 A1 | 7/2010 | Jin et al. |
| 2010/0238090 A1 | 9/2010 | Pomerantz et al. |
| 2011/0025594 A1 | 2/2011 | Watanabe |
| 2011/0057861 A1 | 3/2011 | Cok et al. |
| 2011/0102300 A1 | 5/2011 | Wood et al. |
| 2011/0242686 A1 | 10/2011 | Wantanbe |
| 2012/0218219 A1 | 8/2012 | Rappoport et al. |
| 2013/0081756 A1 | 4/2013 | Franklin et al. |
| 2013/0083080 A1 | 4/2013 | Rappoport et al. |
| 2013/0235560 A1 | 9/2013 | Etienne et al. |
| 2013/0279088 A1 | 10/2013 | Raff et al. |
| 2014/0037257 A1* | 2/2014 | Yang .................... G02B 6/0078 385/116 |
| 2014/0092028 A1 | 4/2014 | Prest et al. |
| 2014/0092346 A1 | 4/2014 | Yang et al. |
| 2014/0183473 A1 | 7/2014 | Lee et al. |
| 2014/0240985 A1 | 8/2014 | Kim et al. |
| 2014/0328041 A1 | 11/2014 | Rothkopf et al. |
| 2014/0354920 A1 | 12/2014 | Jang et al. |
| 2015/0093087 A1 | 4/2015 | Wu |
| 2015/0227227 A1 | 8/2015 | Myers et al. |
| 2016/0231784 A1 | 8/2016 | Yu et al. |
| 2016/0234362 A1 | 8/2016 | Moon et al. |
| 2017/0199322 A1* | 7/2017 | Ochi .................... G02B 6/0051 |
| 2017/0235341 A1 | 8/2017 | Huitema et al. |
| 2018/0052312 A1 | 2/2018 | Jia et al. |
| 2018/0088416 A1 | 3/2018 | Jiang et al. |
| 2018/0372958 A1 | 12/2018 | Karafin et al. |
| 2019/0302327 A1* | 10/2019 | Murata ................. G02F 1/1335 |

* cited by examiner

METHODS FOR FORMING IMAGE TRANSPORT LAYERS

This application claims the benefit of provisional patent application No. 62/760,754, filed Nov. 13, 2018, and provisional patent application No. 62/717,626, filed Aug. 10, 2018, which are hereby incorporated by reference herein in their entireties.

Field

This relates generally to electronic devices and, more particularly, to electronic devices with displays.

Background

Electronic devices such as cellular telephones, tablet computers, and other electronic equipment may include electronic components. The electronic components may include components that emit light such as displays.

If care is not taken, electronic devices with displays and other light-emitting components may not have a desired appearance or may be difficult to use satisfactorily. For example, displays may be bulky and unattractive or may not exhibit desired performance.

Summary

An electronic device may have a display. The display may be coupled to a housing. Pixels in the display may be configured to display an image.

The electronic device may have an image transport layer that is interposed between the display and the display cover layer. The image transport layer may alternatively not be covered by a display cover layer and may form an exterior surface of the electronic device. The image transport layer may be formed from a coherent fiber bundle or Anderson localization material.

The image transport layer may have an input surface that receives the image that is being displayed by the pixels and may have a corresponding output surface. The received image from the input surface may be transported through the image transport layer to the output surface. The image that is presented on the output surface may be viewed by a user directly or through a cover layer.

Various methods may be used to form image transport layers. One or more techniques such as swelling (in which fibers expand into openings), piping (in which a pre-cut group of fibers that are parallel, unbent, and varying in length is bent), and slumping (in which a group of parallel, unbent fibers is heated and bent) may be used to process fibers and form image transport layers. A fiber bundle that is used to form an image transport layer may include fibers that have varying properties such as diameter, pitch, and tensile strength.

DETAILED DESCRIPTION

Electronic devices may be provided with displays. A display in an electronic device may have an array of pixels for displaying images. To help enhance device aesthetics and/or to help enhance performance, the electronic device may include structures that transport light from an input surface to an output surface through a coherent fiber bundle or a layer of Anderson localization material. Structures such as these may sometimes be referred to as image transport layers, image transport structures, image transport layer structures, etc.

As an example, an electronic device may have a display on which an image is displayed. An image transport layer may overlap the display so that an input surface of the image transport layer is adjacent to the display and receives the image from the display. The image transport layer transports the image from the input surface to a corresponding output surface of the image transport layer. The output surface faces outwardly from the device so that the image on the output surface may be viewed by a user of the electronic device. If desired, the output surface may have a curved cross-sectional profile.

The displays may have planar surfaces and curved surfaces. For example, a display may have a planar central portion surrounded by bent edges. The bent edges may have curved surface profiles. Arrangements in which displays exhibit compound curvature may also be used. Electronic devices having displays with curved surfaces may have an attractive appearance, may allow the displays to be viewed from a variety of different angles, and may include displays with a borderless or nearly borderless configuration.

Figure 1:
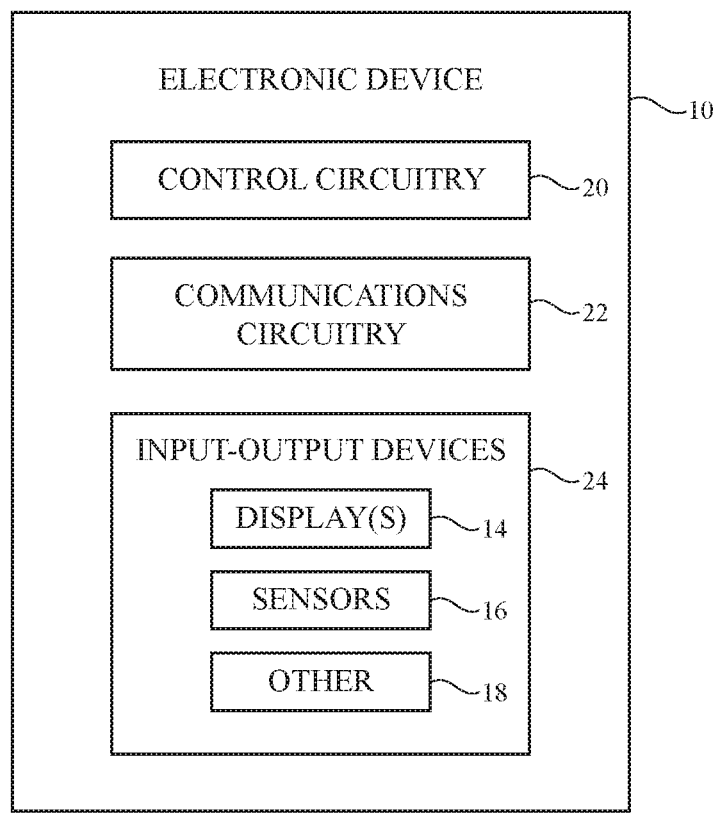
FIG. 1 is a schematic diagram of an illustrative electronic device in accordance with an embodiment.

A schematic diagram of an illustrative electronic device having a display is shown in FIG. 1. Electronic device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external equipment, control circuitry 20 may communicate using communications circuitry 22. Circuitry 22 may include antennas, radio-frequency transceiver circuitry, and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 10 GHz and 400 GHz, a 60 GHz link, or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display(s) 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Display 14 may have an array of pixels configured to display images for a user. The display pixels may be formed on one or more substrates such as one or more flexible substrates (e.g., display 14 may be formed from a flexible display panel). Conductive electrodes for a capacitive touch sensor in display 14 and/or an array of indium tin oxide electrodes or other transparent conductive electrodes overlapping display 14 may be used to form a two-dimensional capacitive touch sensor for display 14 (e.g., display 14 may be a touch sensitive display).

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
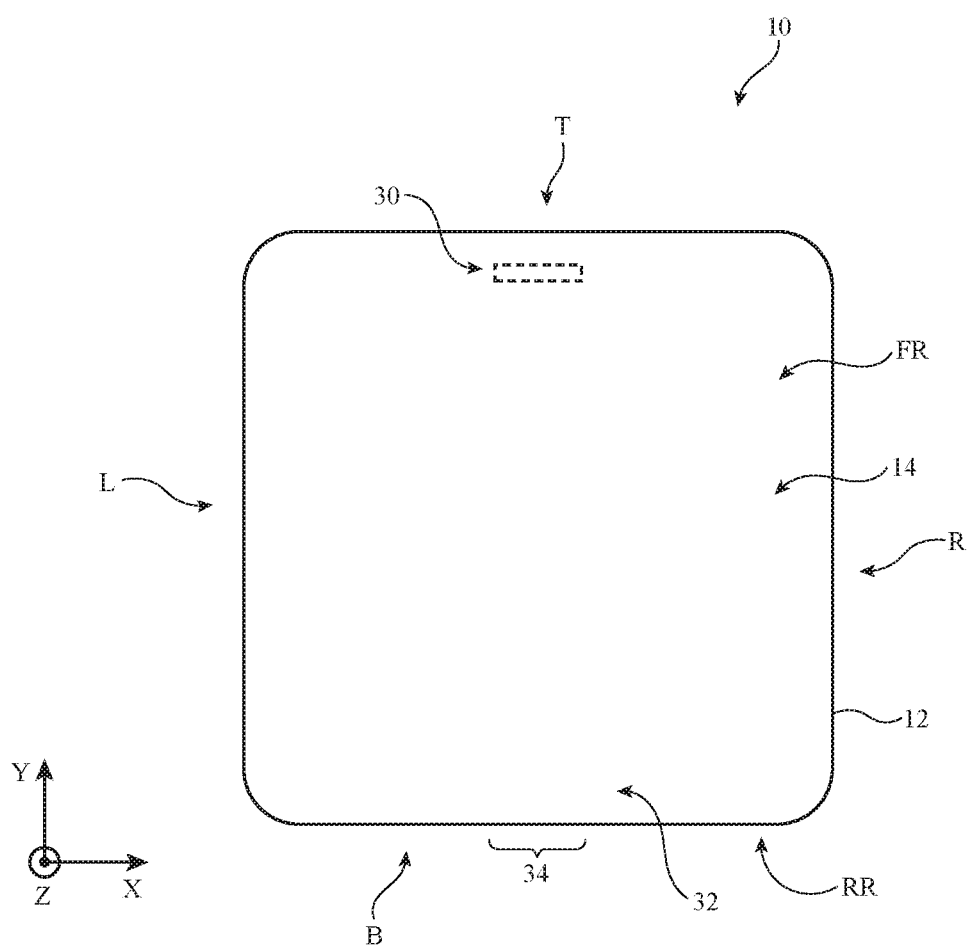
FIG. 2 is a top view of an illustrative electronic device in accordance with an embodiment.

FIG. 2 is a front (plan) view of electronic device 10 in an illustrative configuration in which display 14 covers some or all of the front face FR of device 10. Opposing rear face RR of device 10 may be covered by a housing wall formed from glass, metal, polymer, and/or other materials. Rear face RR may be free of display pixels and/or may be partly or fully covered by display 14.

Device 10 may include a housing (e.g., housing 12) that forms sidewall structures for device 10 and/or internal supporting structures (e.g., a frame, midplate member, etc.). Glass structures, transparent polymer structures, image transport layer structures, and/or other transparent structures that cover display 14 and other portions of device 10 may provide structural support for device 10 and may sometimes be referred to as housing structures. For example, a glass or polymer layer that covers and protects a pixel array in display 14 may serve as a display cover layer while also serving as a housing structure for device 10.

In some illustrative arrangements, sidewall portions of device 10 may be covered with portions of display 14. In the example of FIG. 2, device 10 is characterized by four peripheral edges: upper edge T, lower edge B, left edge L, and right edge R. Upper edge T and opposing lower edge B may run parallel to each other and parallel to the X axis of FIG. 2. Left edge L and opposing right edge R may run parallel to each other and parallel to the Y axis of FIG. 2. Front face FR and rear face RR may be planar (e.g., two parallel planes offset by a distance along the Z axis) and/or may include curved portions.

Touch sensor circuitry such as two-dimensional capacitive touch sensor circuitry may be incorporated into one or more displays in device 10 as separate touch sensor panels overlapping display pixels or as part of one or more display panels in device 10. Touch sensors may be formed on front face FR, rear face RR, and/or edges (sidewall faces) T, B, R, and/or L. If desired, icons and other images for virtual buttons may be displayed by the pixels of device 10. For example, virtual buttons and/or other images may be displayed on front face FR, rear face RR, and/or edges T, B, R, and/or L and may overlap touch sensor circuitry. Haptic output devices may be used to provide haptic feedback when virtual buttons are selected (as an example).

Device 10 of FIG. 2 has a rectangular outline (rectangular periphery) with four rounded corners. If desired, device 10 may have other shapes. For example, device 10 may have a shape that folds and unfolds along a bend (folding) axis and may include a display that overlaps or that does not overlap the bend axis, may have a shape with an oval footprint or circular outline, may have a cubic shape, may have a pyramidal, cylindrical, spherical, or conical shape, or may have other suitable shapes. The configuration of FIG. 2 is illustrative.

If desired, openings may be formed in the surfaces of device 10. For example, a speaker port and optical windows for an ambient light sensor, an infrared proximity sensor, and a depth sensor may be formed in a region such as upper region 30 of front face FR. A fingerprint sensor, touch sensor button, force-sensitive button, or other sensor that operates through display 14 may be formed under the portion of display in lower region 32 on front face FR and/or other portions of front face FR and/or other external surfaces of device 10. Device 10 may be free of connector openings or an opening for a connector (e.g., a digital data connector, analog signal connector, and/or power connector) may be formed in portion 34 of the lower sidewall of device 10 running along lower edge B or elsewhere in device 10. Openings may be omitted when power is received wirelessly or is received through contacts that are flush with the surface of device 10 and/or when data is transferred and received wirelessly using wireless communications circuitry in circuitry 22 or through contacts that are flush with the exterior surface of device 10.

Figure 3:
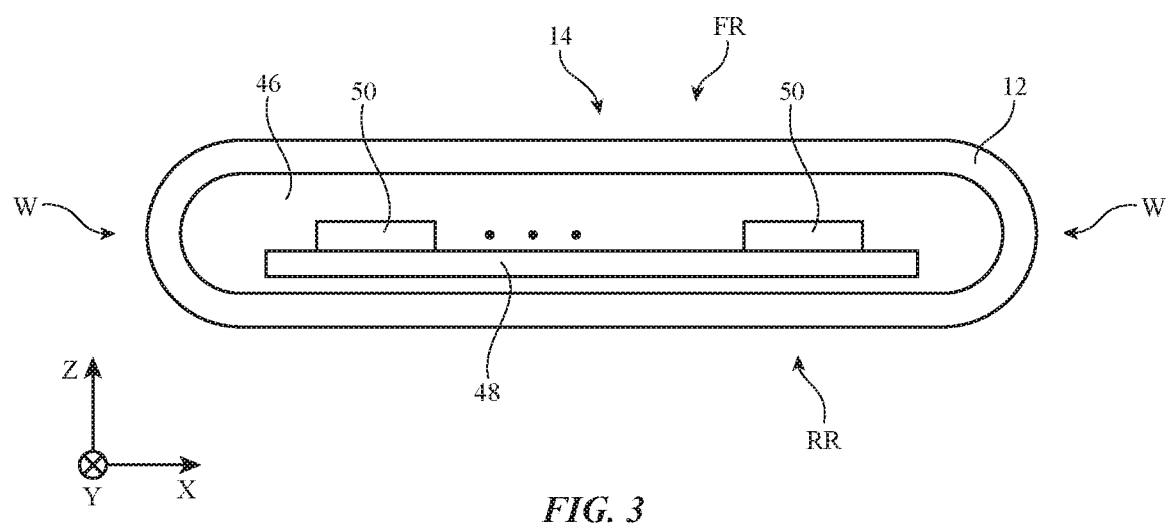
FIG. 3 is a cross-sectional side view of an illustrative electronic device in accordance with an embodiment.

FIG. 3 is a cross-sectional side view of an illustrative electronic device. As shown in FIG. 3, device 10 may have a housing such as housing 12. Housing 12 may include structures formed from glass, polymer, metal, wood, sapphire or other crystalline material, ceramic, fabric, other materials, and/or combinations of these materials. In some configurations, transparent portions of housing 12 may be configured to form display cover layers that overlap one or more displays or other light-emitting optical components. In the example of FIG. 3, display 14 is formed on front face FR of device 10. Display 14 includes an array of pixels. During operation, the pixels are used to display an image for viewing by a user of device 10. Arrays of pixels for displays in device 10 may sometimes be referred to as pixel layers, pixel array layers, displays, display structures, display layers, or display panels. In general, displays and other optical components may be located on front face FR, rear face RR, and/or sidewalls W of device 10 (e.g., sidewalls on edges T, B, R, and/or L). Housing 12 may have planar portions (e.g., in central portions of front face FR and rear face RR and/or on sidewalls W of device 10) and/or curved portions (e.g., curved edges, curved corners, portions of front face FR and/or rear face RR that have curved cross-sectional profiles, etc.).

As shown in FIG. 3, device 10 may include electrical components 50 in interior 46 (e.g., integrated circuits, sensors and other input-output devices, control circuitry, display layers such as organic light-emitting diode panels or other display layers, etc.). Electrical components 50 may, if desired, be mounted on printed circuits such as printed circuit 48 (e.g., flexible printed circuits and/or printed circuits formed from rigid printed circuit board material). In some configurations, a display may be formed on rear face RR. In other configurations, no display is present on rear face RR. In configurations in which no display is present on rear face RR, the portion of housing 12 on rear face RR may be formed from metal (e.g., a stainless steel or aluminum layer). For example, device 10 may have a rear housing wall formed from metal and may have optional sidewalls that extend upwardly from the rear housing wall. If desired, device 10 may have a rear housing wall and/or other housing walls formed from opaque glass, transparent glass coated with opaque materials such as ink or metal, and/or other housing wall materials.

In some configurations for device 10, an opaque material such as metal or opaque polymer may form some or all of sidewalls W of device 10. As an example, metal that forms some or all of a rear housing wall on rear face RR of device 10 may protrude upwardly along the edges of device 10 to form some or all of the sidewalls for device 10. As another example, a peripheral metal band that forms some or all of the sidewalls of device 10 may extend around the rectangular periphery of device 10 (e.g., along upper edge T, right edge R, lower edge B, and left edge L). Sidewalls may have vertically extending planar surfaces and/or may exhibit other surface profiles (e.g., curved profiles).

If desired, some or all of the sidewalls of device 10 may be formed from clear material and may overlap light-producing components. This material may, as an example, be part of a display cover layer (e.g., a sidewall may be formed from an extension of a central display cover layer portion and may be formed from glass, polymer, crystalline material, etc.). Because clear layers of glass, plastic, crystalline material, and/or other clear layers of material in device 10 may enclose and protect internal device components, these outer layers of material in device 10 may serve as portions of housing 12 for device 10.

In configurations for device 10 in which sidewalls have transparent portions formed from extending portions of a display cover layer or other transparent material, the sidewalls may overlap light-emitting components. Transparent sidewalls may have planar and/or curved surfaces and may be formed from clear glass, clear polymer, transparent crystalline material such as sapphire, and/or other transparent protective material. Displays (pixel arrays), light-emitting diodes covered with diffusing material, light-emitting diodes covered with patterned masks (e.g., opaque coatings with icon-shaped openings or openings of other shapes), and/or other light-emitting devices may be placed under clear sidewalls.

Figure 4:
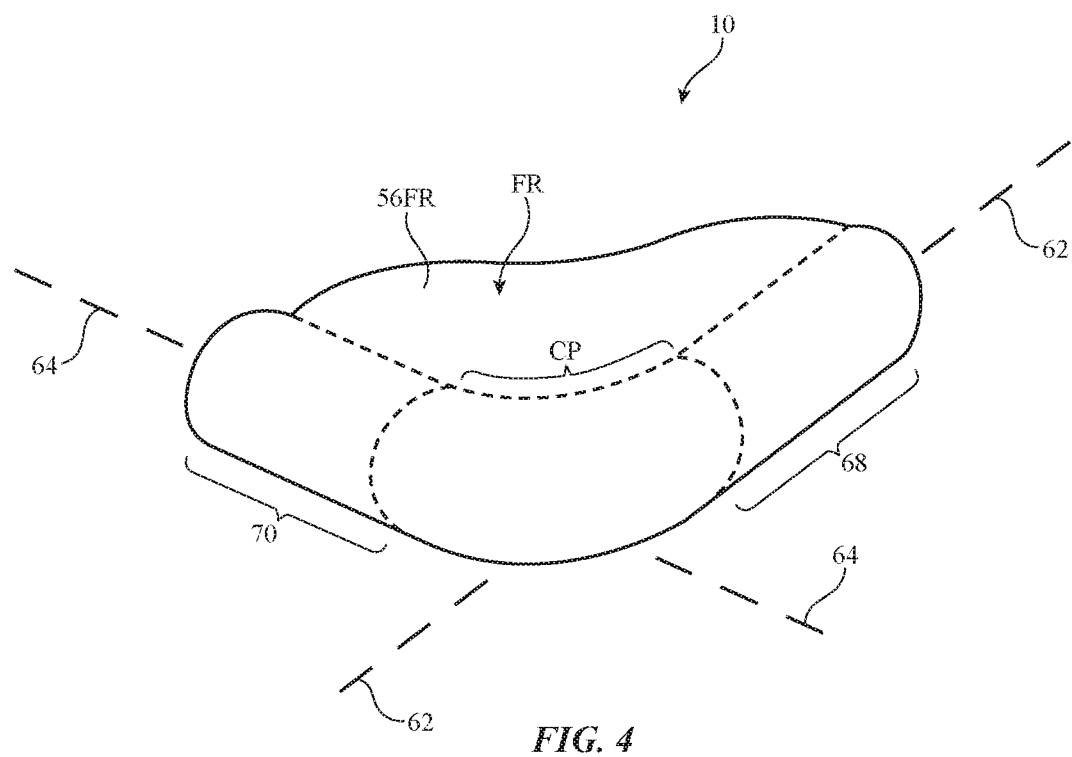
FIG. 4 is a perspective view of an illustrative corner of an electronic device in accordance with an embodiment.

If desired, device 10 may have external surfaces with compound curvature. A perspective view of an illustrative corner portion of device 10 is shown in FIG. 4. In the example of FIG. 4, device 10 has edge portions 68 and 70 formed from sidewalls W (FIG. 3). Edge portions 68 and 70 may have surfaces that curve about axes 62 and 64, respectively. These portions of housing 12 extend along the straight sides of device 10 and are characterized by curved surfaces that can be flattened into a plane without distortion (sometimes referred to as developable surfaces). At the corner of device 10 of FIG. 4, device 10 has curved surface portions CP with compound curvature (e.g., a surface that can only be flattened into a plane with distortion, sometimes referred to as a surface with Gaussian curvature). Each of the four corners of device 10 may have this arrangement, if desired.

Flexible displays such as organic light-emitting diode displays with flexible polyimide substrates or other bendable polymer substrates can be bent about axes such as axes 62 and 64 to form curved surfaces in portions 68 and 70 (e.g., these substrates may be bent without wrinkling or other undesired deformation). In compound curvature regions such as corner regions of device 10, display 14 can be formed from materials that stretch (e.g., displays formed from mesh-shaped elastomeric substrate material), may be formed from flexible displays that are patterned to create one or more flexible strips and/or other structures that can be bent to cover at least part of the compound curvature regions, may be formed from bent tab portions that are part of a display (display substrate) that also is overlapped by a display cover layer on front face FR and/or other portions of device 10, may be formed using pixels on one or more display substrates that are separate from a main central display substrate, and/or may be formed from other display structures.

To help accommodate optical components within housing 12, device 10 (e.g., housing 12) may include one or more image transport layer structures (e.g., coherent fiber bundles or Anderson localization material). The image transport layer structures may transport light (e.g., image light and/or other light) from one surface to another while preventing the light from spreading laterally and thereby preserving the integrity of the image light or other light. This allows an image produced by an array of pixels in a flat or curved display to be transferred from an input surface of a first shape at a first location to an output surface with compound curvature or other desired second shape at a second location. The image transport layer may therefore move the location of an image and may optionally change the shape of the surface on which the image is presented.

Figure 5:
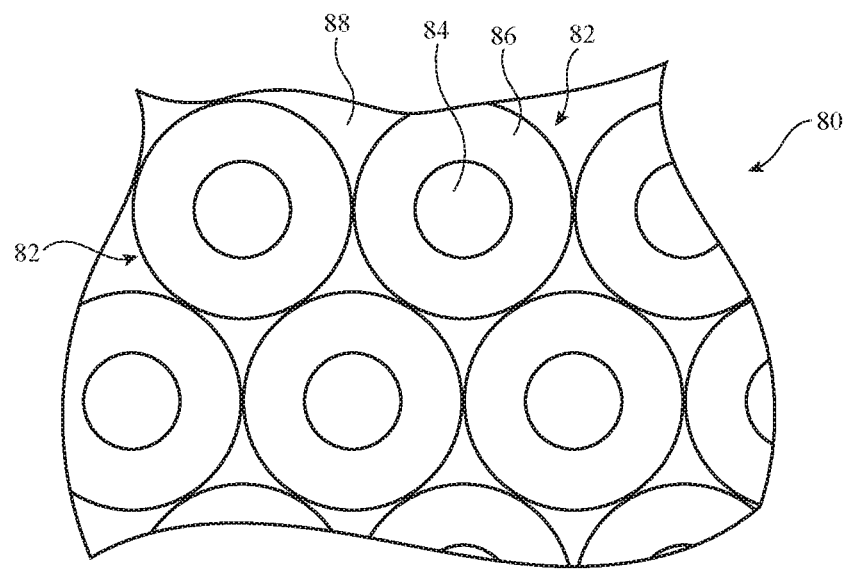
FIG. 5 is a top view of an illustrative image transport layer in accordance with an embodiment.

Fiber bundles include fiber cores of a first refractive index surrounded by cladding (e.g., polymer) of a second, lower refractive index. In some configurations, additional polymer, which may sometimes be referred to as binder or secondary cladding, may be included. A cross-sectional view of an illustrative image transport layer formed from a fiber bundle is shown in FIG. 5. In the example of FIG. 5, image transport layer 80 is formed from a bundle of fibers 82. Fibers 82 may have respective fiber cores 84. Cores 84 may be surrounded by material with a different index of refraction than cores 84. For example, each core 84 may have a first index of refraction and the material surrounding that core may have a second index of refraction that is lower than the first index of refraction by an index difference of at least 0.05, at least 0.1, at least 0.15, at least 10%, at least 20%, less than 50%, less than 30%, or other suitable amount. When the material surrounding cores 84 has a refractive index that is lower than cores 84, light may be guided within cores 84 in accordance with the principal of total internal reflection.

In the example of FIG. 5, cores 84, which may be formed from transparent material such as glass or polymer, are surrounded by lower index structures such as claddings 86 (e.g., glass or polymer of lower refractive index). Additional material (e.g., optional binder 88) may be included in image transport layer 80 (e.g., to hold fibers 82 in place, etc.). Binder 88 may be formed from a material (e.g., polymer or glass) with a refractive index lower than that of cores 84 and/or lower than that of cladding 86 to promote total internal reflection in cores 84. In some configurations, cores 84 may be coated with metal and/or surrounded by air or other material to help confine light within cores 84. Arrangements in which some of cores 84, some of cladding 86, and/or some of binder 82 are formed from materials such as opaque material, colored transparent material, infrared-light-blocking-and-visible-light-transmitting material, infrared-light-transmitting-and-visible-light-blocking material, and/or other materials may also be used. For example, some of these structures may be formed from a black polymer or other light-absorbing material to help absorb stray light (e.g., light that is not being guided within cores 84). If desired, polymer 88 may be omitted (e.g. in arrangements in which cladding 86 is used to hold fibers 82 together in image transport layer 80).

The diameters of cores 84 may be, for example, at least 5 microns, at least 7 microns, at least 8 microns, at least 9 microns, less than 40 microns, less than 17 microns, less than 14 microns, less than 11 microns, or other suitable diameter. Fibers 82 may have diameters of at least 6 microns, at least 7 microns, at least 8 microns, at least 9 microns, less than 50 microns, less than 17 microns, less than 14 microns, less than 11 microns, or other suitable diameter.

Figure 6:
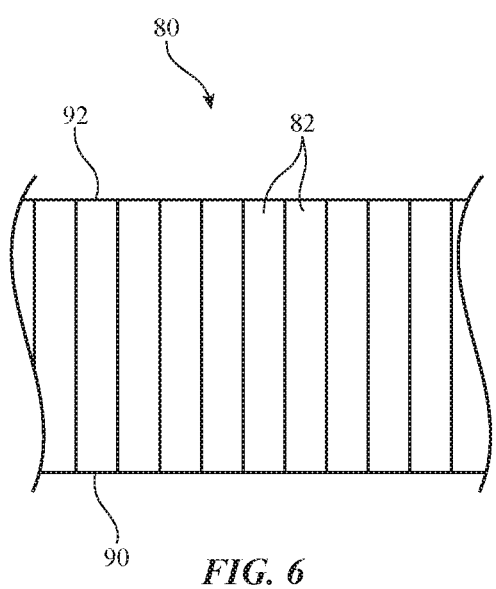
FIG. 6 is a cross-sectional side view of an illustrative image transport layer in accordance with an embodiment.

As shown in FIG. 6, fibers 82 may extend parallel to each other in image transport layer 80 (e.g., the fibers may run next to each other along the direction of light propagation through the fiber bundle). This allows image light or other light that is presented at input surface 90 to be conveyed to output surface 92. In the example of FIG. 6, surfaces 90 and 92 are planar and fibers 82 extend in straight lines between surfaces 90 and 92. Other arrangements such as arrangements in which fibers 82 are bent and/or taper and/or in which surface 90 and/or surface 92 have curved cross-sectional profiles may also be used.

In general, image transport layers such as image transport layer 80 of FIG. 6 and the other FIGS. may be formed from a coherent fiber bundle (see, e.g., FIG. 5) or may be formed from Anderson localization material instead of a coherent fiber bundle. Anderson localization material is characterized by transversely random refractive index features (higher index regions and lower index regions) of about two wavelengths in lateral size that are configured to exhibit two-dimensional transverse Anderson localization of light (e.g., the light output from the display of device 10). These refractive index variations are longitudinally invariant (e.g., along the direction of light propagation, perpendicular to the surface normal of a layer of Anderson localization material). Configurations in which image transport layer 80 has a bundle of fibers 82 are sometimes described herein as an example.

Fiber bundles and Anderson localization material can be used to form plates (e.g., layers with a thickness of at least 0.2 mm, at least 0.5 m, at least 1 mm, at least 2 mm, at least 5 mm, less than 20 mm, or other suitable thickness) and/or other image transport structures (e.g., straight and/or bent elongated light pipes, spherical shapes, cones, tapered shapes, etc.). As described in connection with FIG. 6, the surfaces of image transport structures may be planar and/or may have curved profiles.

Image transport layers can be used to transport an image from a first surface (e.g., the surface of a pixel array) to a second surface (e.g., a surface in device 10 with compound curvature or other curved and/or planar surface shape) without causing the image light to spread laterally. For example, an image that is produced by a display can be transported 5 mm vertically through an image transport layer that is 5 mm thick and can then be viewed on the output surface of the image transport layer. As another example, an image transport layer may have a planar input surface and an output surface with a planar central region surrounded by curved edges and corners of compound curvature. With this type of arrangement, images produced by a display that rests against the planar input surface can be smoothly transported to an output surface without becoming blurred, even if the output surface contains curved portions such as areas of compound curvature. Curved image transport layer surfaces can be formed by polishing, slumping heated fiber bundle material, molding under heat and/or pressure, etc. In devices with optical sensors and other optical components, light may, if desired, be transported through an image transport structure to and/or from an optical component.

In portions of device 10 that have an externally viewable display, a display cover layer that forms at least part of housing 12 may be used to cover and protect image transport layer 80 or an image transport layer that is uncovered by a separate display cover layer may be used in forming at least part of housing 12.

In arrangements in which a display cover layer is used to cover and project layer 80, adhesive, touch sensor structures, diffuser layers, masking layers, filter layers, antireflection layers, and/or other structures may optionally be interposed between layer 80 and the display cover layer. The display cover layer may be formed from glass, polymer, ceramic, crystalline material such as sapphire, multiple layers of these materials and/or other materials and may have optional coatings (e.g., an antireflection layer, an antiscratch layer, an antismudge layer, etc.). The display cover layer may form some or all of housing 12 of FIG. 3. A display layer with an array of pixels that displays an image may be located within the interior of housing 12. Image transport layer 80 may be interposed between the array of pixels and the display cover layer so that the image on the pixel array is transported from the input surface of the image transport layer to the output surface of the image transport layer. The image on the output surface of the image transport layer is visible through the display cover layer forming the portion of housing 12 that overlaps the image transport layer.

In arrangements in which no display cover layer is present, one or more portions of housing 12 of FIG. 3 may be formed from an image transport layer that is not covered with a separate protective member. For example, an image transport layer with a planar central portion, curved peripheral edges, and corners of compound curvature may be used to form an upper portion and sidewall portion of housing 12. In this type of configuration, the outside of image transport layer 80 is not covered with a separate display cover layer member so that output surface 92 forms the outermost surface of housing 12 of FIG. 3. The pixel array may be formed against input surface 90 of the image transport layer, which may form the innermost surface of housing 12 of FIG. 3.

During use, output surface 92 may contact external objects. To prevent damage to image transport layer 80 (e.g., the portion of housing 12 of FIG. 3 that overlaps the pixel array), output surface 92 may be strengthened using a chemical strengthening process or other strengthening process. For example, in a scenario in which layer 80 is formed from glass, surface 92 of layer 80 may be strengthened using an ion exchange chemical strengthening treatment and/or other strengthening processes (e.g., heat treatment, etc.). Chemical strengthening may be performed by placing a glass image transport layer in a heated potassium salt bath to perform an ion-exchange process. Chemical strengthening in this way may enhance the compressive stress of the outermost surfaces of the glass image transport layer relative to deeper portions. Heat treatment (e.g., thermal tempering) may also be used to create compressive stress on outer surfaces of image transport layer 80. By creating compressive stress on the surface of image transport layer 80, the strength of output surface 92 may be enhanced. If desired, an antiscratch coating, an antireflection coating, an antismudge coating, and/or other exterior coating layers may be applied to surface 92. When layer 80 is strengthened at output surface 92, layer 80 is able to withstand damage during drop events and other events that impose stress on layer 80.

Illustrative image transport layers 80 are shown in FIGS. 7, 8, 9, 10, and 11. Structures such as these may have lower surfaces that serve as input surfaces (e.g., to receive image light from a display) and opposing upper surfaces (e.g., surfaces with curved edges aligned with the periphery of device 10). For example, structures such as these may be provided on front surface FR so that the curved edges of these structures run around the periphery of device 10 while the planar portions of these structures overlap the center of display 14 on front surface FR (as an example).

Figure 7:
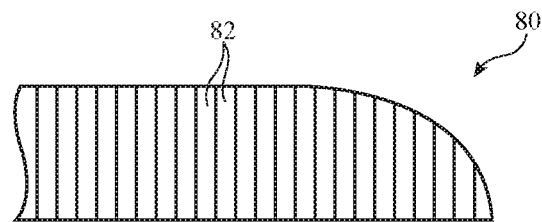
FIGS. 7, 8, 9, 10, and 11 are cross-sectional side views of illustrative image transport layers in accordance with embodiments.

As shown in the example of FIG. 7, fibers 82 may be oriented to extend vertically through image transport layer 80.

Figure 8:
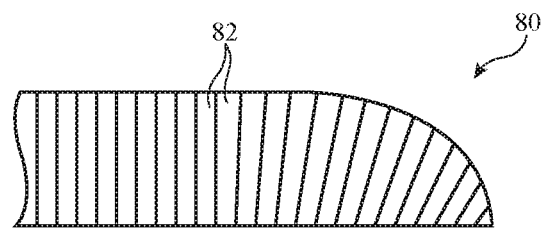

FIG. 8 shows how fibers 82 may be tilted by progressively increasing amounts at increasing distances toward the curved outer peripheral edge of image transport layer 80.

Figure 9:
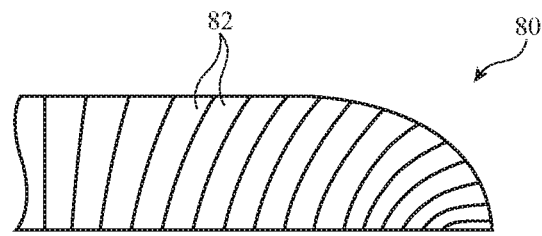

In the example of FIG. 9, fibers 82 are both tilted and curved.

Figure 10:
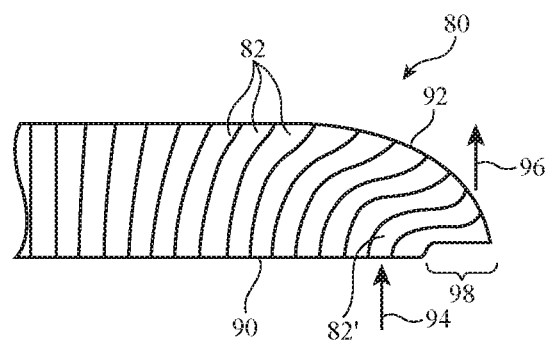

FIG. 10 shows how fibers 82 may contain multiple bends along their lengths. This allows the entrances and exit portions of the fibers to be oriented along the desired direction of light propagation. As an example, fiber 82' may have an entrance portion with a longitudinal axis that is aligned parallel or nearly parallel to light entrance direction 94 so that light from a display or other optical component may be emitted efficiently into fiber 82 in direction 94. Fiber 82' may also have an exit portion with a longitudinal axis that is aligned parallel or nearly parallel to light emission direction 96 (e.g., a direction facing a viewer) so that light emitted from the curved edge portion of image transport layer will be directed toward the viewer rather than being angled away from the viewer. If desired, the entrance and output faces of each fiber may be oriented to facilitate light output in desired directions. Optional grooves and other structures may also be formed in image transport layer 80 (see, e.g., illustrative peripheral groove 98). This may facilitate the coupling of layer 80 to a housing structure and/or may otherwise facilitate the mounting of image transport layer 80 within device 10 (as an example).

Figure 11:
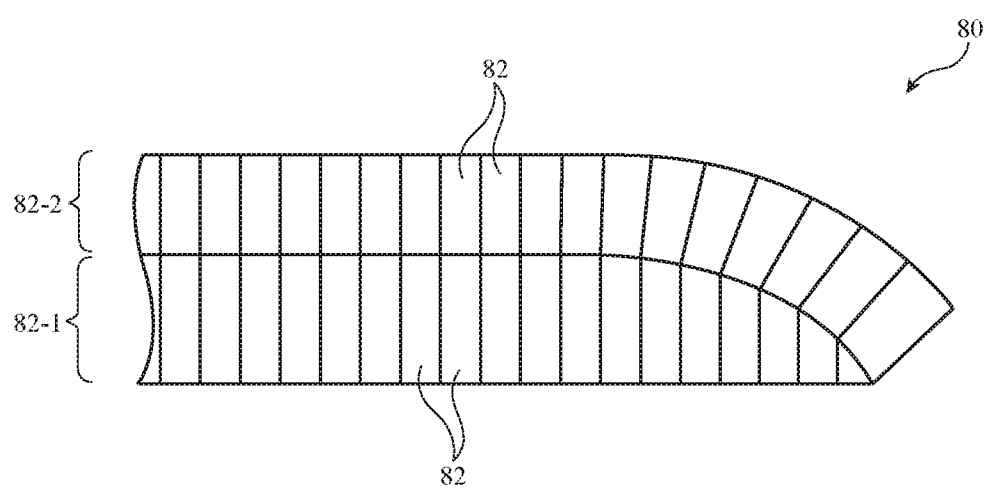

In the illustrative configuration of FIG. 11, image transport layer 80 has multiple overlapped portions such as lower portion 80-1 and upper portion 80-2. Portions 80-1 and 80-2 may be plates or other layers that have fibers 82 with different orientations. As an example, portion 80-1 may have vertically oriented fibers 82 and portion 80-2 may have tilted fibers that are oriented at a non-zero angle with respect to fibers 82 in portion 80-1. Fibers 82 in different portions of layer 80 may, if desired, be aligned end-to-end. Arrangements in which fibers 82 in different portions of layer 80 are not aligned may also be used. If desired, image transport layer 80 may have three or more overlapped layers of fibers with potentially different orientations and/or shapes. Each sublayer of fibers 82 in layer 80 may have input and/or output surfaces that are planar and/or that are curved. The configuration of FIG. 11 is merely illustrative.

Device 10 may include one or more protective structures formed from clear portions of housing 12. As an example, housing 12 of device 10 may have a clear portion such as portion 12-1 of FIG. 12 that overlaps image transport layer 80 and display layer 100. Housing 12 may also have a portion such as portion 12-2 (e.g., a metal housing wall, a transparent housing wall such as a glass housing wall with an inner surface covered with an opaque masking material such as ink, metal, and/or other coating materials, and/or other housing wall materials).

Portion 12-1 may form a display cover layer that covers a display layer such as display layer 100. Alternatively, portion 12-1 may be omitted and image transport layer 80 may form portion 12-1 of the housing (e.g., image transport layer 80 may form exterior surfaces of the electronic device). Display layer 100 may have an active area such as active area 104 with an array of pixels 102 that display an image for a viewer such as viewer 108 who is viewing device 10 in direction 110. Display layer 100 may also have an inactive area such as inactive border area 106 that contains metal signal paths, display driver circuitry, encapsulation structures, and other structures that do not emit light. Inactive border area 106 of display layer 100 is free of pixels and therefore does not display any part of the image that is displayed by display layer 100.

Figure 12:
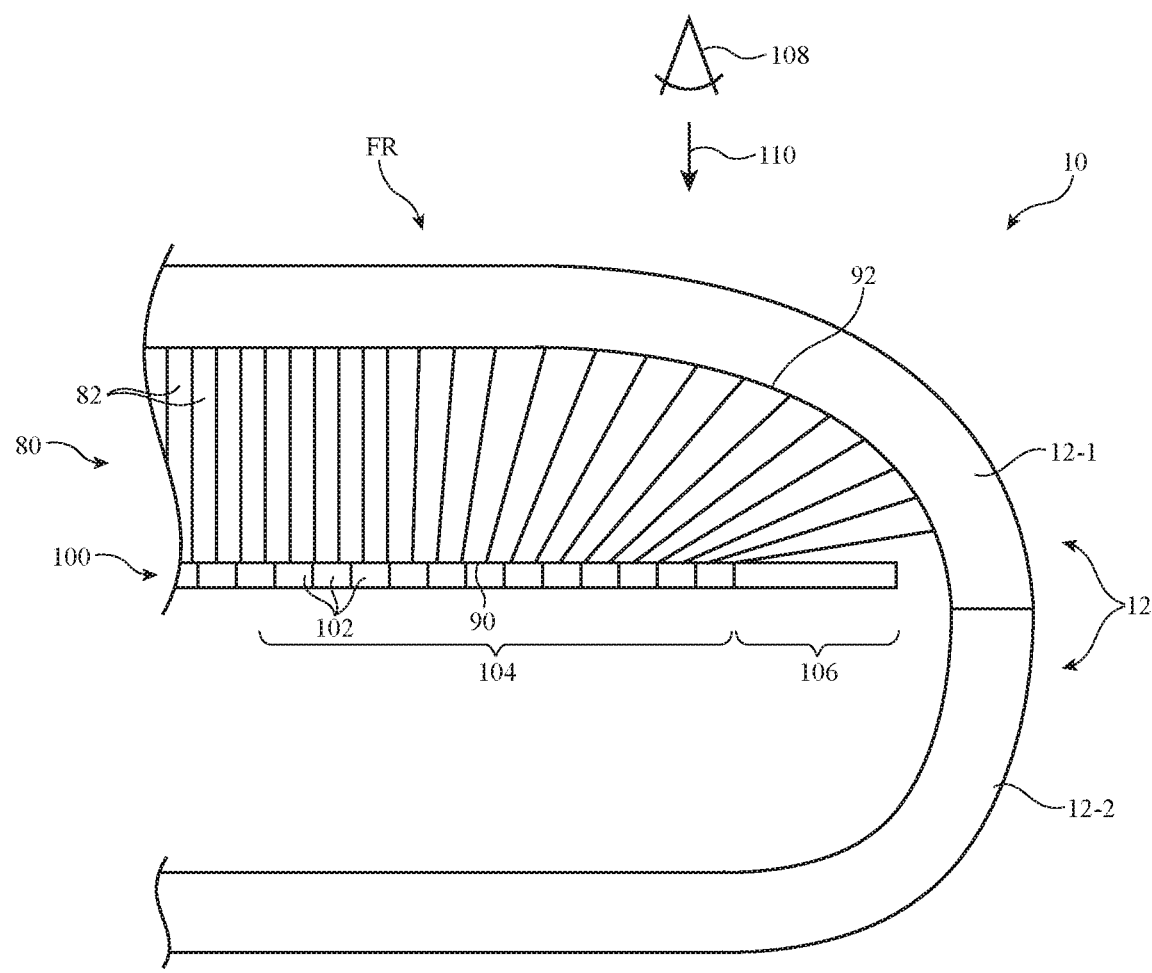
FIGS. 12, 13, and 14 are cross-sectional side views of portions of illustrative electronic devices with image transport layers in accordance with embodiments.

To help hide inactive border area 106 from view by viewer (user) 108, some of fibers 82 of image transport layer 80 may be tilted as shown in FIG. 12. As a result, the image from the pixel array in active area 104 on input surface 90 of layer 80 will be transported to an enlarged output surface 92. Surface 92 overlaps inactive border area 106 when device 10 and display layer 100 are viewed in direction 110 as viewer 108 is viewing front face FR of device 10, so that the image on surface 92 extends to the outermost periphery of device 10 or nearly to the outermost periphery of device 10, thereby hiding inactive border area 106 from view. Image transport layer 80 of FIG. 12 also has a curved edge profile and may have corners of compound curvature. Displays of the type shown in FIG. 12 may sometimes be referred to as borderless (because the output surface 92 may extend across the entire width of the device without any visible inactive areas that do not emit light).

Figure 13:
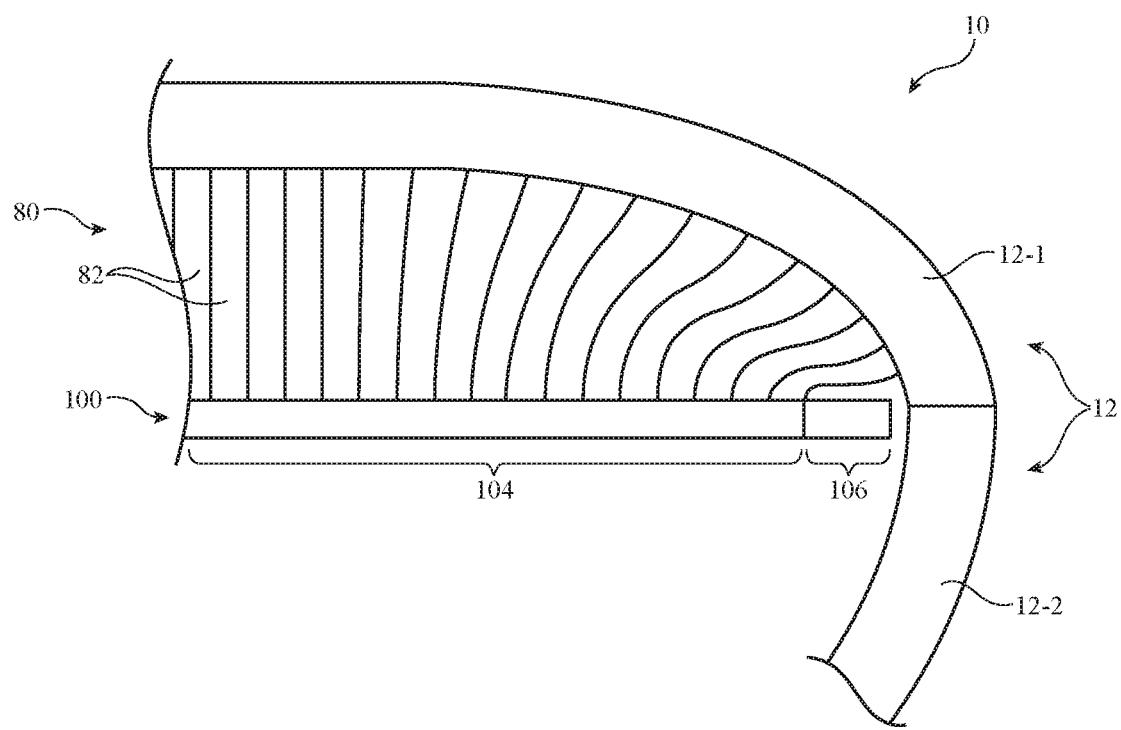
Figure 14:
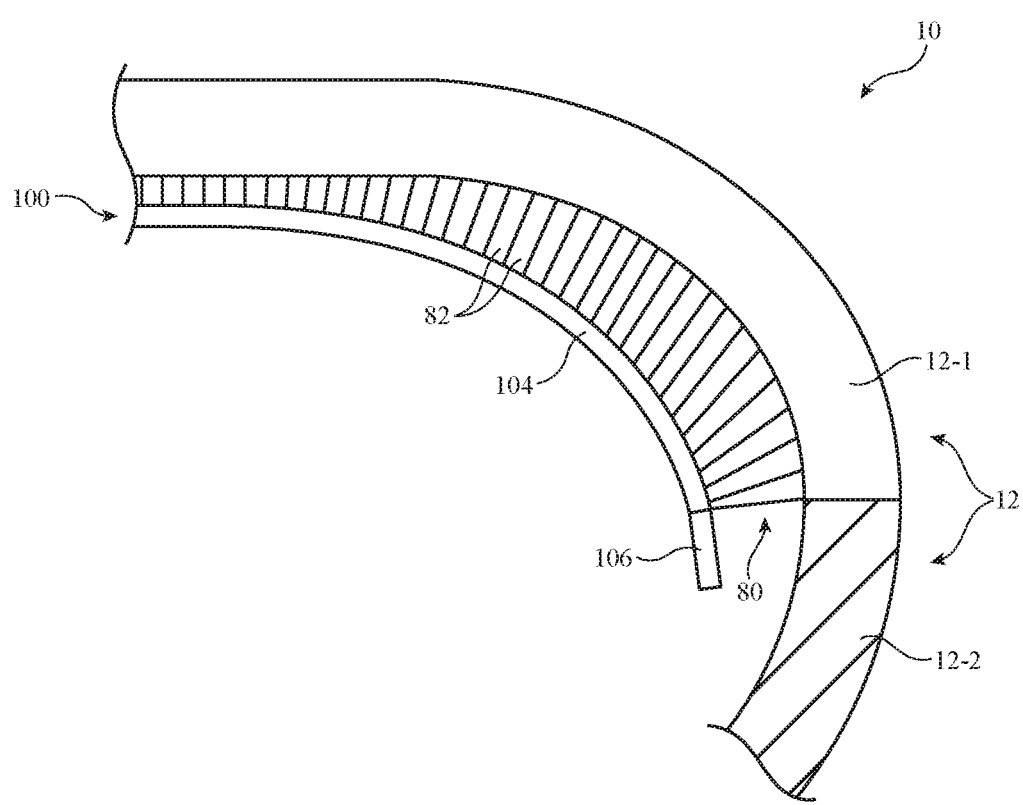

In the example of FIG. 12, fibers 82 are tilted by increasing amounts at increasing distances from the outer edge of area 104 toward the periphery of device 10. If desired, fibers 82 may have one or more bends along their lengths, as shown in the illustrative arrangement for device 10 that is shown in FIG. 13. FIG. 14 shows how display layer 100 may, if desired, have one or more portions that are bent. Layer 100 may, as an example, be formed from an organic light-emitting diode display substrate of polyimide or other flexible polymer covered with thin-film transistors, thin-film organic light-emitting diode pixels, and/or other thin-film circuitry. In this type of arrangement, layer 100 may have one, two, three, four, or more than four edges with curved cross-sectional profiles as shown in FIG. 14. Image transport layer 80 may have a mating curved input surface that receives an image from layer 100 and may have a curved output surface. The curved output surface of image transport layer 80 may mate with the curved inner surface of housing portion 12-1.

Other arrangements for placing image transport layer 80 over display layer 100 may be used, if desired. For example, portions of image transport layer 80 may, if desired, overlap opaque housing structures (e.g., to provide device 10 with a borderless appearance). Image transport layer 80 may also serve as the outermost structure of device 10 (e.g., housing portion 12-1 may be omitted). The configurations of FIGS. 12, 13, and 14 are illustrative.

In connection with FIG. 10, an example was shown where fibers 82 contain multiple bends along their lengths to allow the entrances and exit portions of the fibers to be oriented along the desired direction of light propagation. An arrangement of this type is shown in more detail in FIG. 15.

Figure 15:
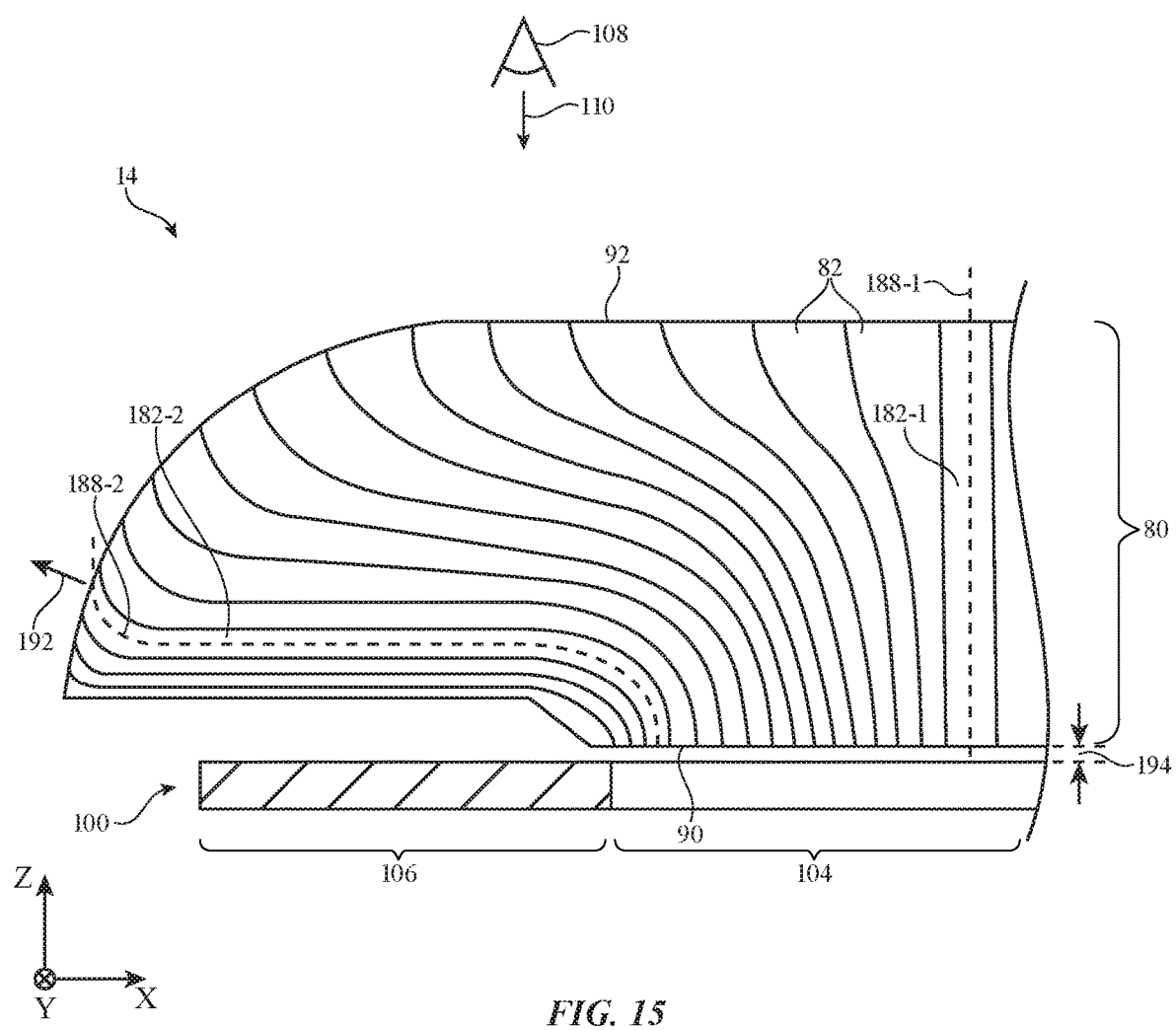
FIG. 15 is a cross-sectional side view of an illustrative image transport layer that includes fibers with bent portions in accordance with an embodiment.

FIG. 15 is a cross-sectional side view of an illustrative image transport layer 80 that transports image light from a display layer to a curved output surface that hides the inactive border area of the display layer. The curved portion of output surface 92 is formed over inactive border area 106 of display layer 100. The curved portion of output surface 92 uses light from the active area 104 to hide inactive border area 106. This arrangement provides a borderless appearance to display 14 when viewed by viewer 108 (because light is emitted across the entire display without any visible non-light-emitting portions).

In the example of FIG. 15, output surface 92 has a planar central portion over the active area and a curved portion over the inactive border area. This example is merely illustrative. In general, output surface 92 may have any desired shape. For example, the portion of output surface 92 over active area 104 may be curved (forming an entirely curved output surface for example). The portion of output surface 92 over active area 104 may have any desired combination of curved portions and planar portions. In another embodiment, the portion of output surface 92 over inactive border area 106 may be planar (forming an entirely planar output surface for example). The portion of output surface 92 over inactive border area 106 may have any desired combination of curved portions and planar portions.

A viewer 108 of the display may typically view the display from the front. In this scenario, the viewer looks in a direction 110 that is orthogonal to the active area of the display. It is desirable that light from each fiber is directed towards viewer 108. Therefore, light from each fiber may be emitted from output surface 92 in a direction that is orthogonal to active area 104.

Each fiber may extend along a respective longitudinal axis (length) between input surface 90 and output surface 92. For example, consider fiber 182-1. Fiber 182-1 extends along a longitudinal axis 188-1 between input surface 90 and output surface 92. The light emitted from fiber 182-1 may be emitted in the direction of longitudinal axis 188-1. Longitudinal axis 188-1 is orthogonal to active area 104 at input face 90 (e.g., at an input portion of the fiber). Longitudinal axis 188-1 is also orthogonal to active area 104 at output face 92 (e.g., at an output portion of the fiber), ensuring that light is emitted from the fiber to viewer 108.

Similarly, fiber 182-2 extends along a longitudinal axis 188-2 between input surface 90 and output surface 92. Longitudinal axis 188-2 is orthogonal to active area 104 at input face 90. At output surface 92, the curvature of the image transport layer results in the surface normal (192) of the output face of fiber 182-2 being at a non-orthogonal angle relative to active area 104. If light was emitted from fiber 182-2 in a direction along the surface normal of the output face, the light would be directed away from viewer 108 as shown in FIG. 15. Therefore, fiber 182-2 may be bent to ensure that longitudinal axis 188-2 is at an angle approximately orthogonal to the active area at the output face.

The longitudinal axis of each fiber may be approximately (e.g., within 20° of, within 15° of, within 10° of, within 5° of, etc.) orthogonal to the active area at the output face of the image transport layer. This arrangement ensures that light from each fiber is directed towards viewer 108 at the front of the display.

The longitudinal axis of each fiber may be at approximately (e.g., within 20° of, within 15° of, within 10° of, within 5° of, etc.) the same angle relative to the active area at both the input face and the output face of the image transport layer. This may remain true even when the fibers are bent between the input surface and output surface (as with fiber 182-2, for example). In other words, fiber 182-2 may have an input portion that extends along a first dimension (e.g., along longitudinal axis 188-2 at input face 90) and an exit portion that extends along a second dimension (e.g., along longitudinal axis 188-2 at output face 92) that is the same as the first dimension. For example, the first dimension may be within 20° of, within 15° of, within 10° of, or within 5° of the second dimension. Fiber 182-2 may have first and second bent portions between the input portion and the output portion of the fiber. The first and second bent portions allow the fiber to guide light over inactive border region 106 while still directing light towards user 108. The light output from each fiber may have a varying intensity as a function of viewing angle (e.g., a Gaussian curve with a peak along the direction of the corresponding longitudinal axis of the fiber). The output light may be concentrated in an output direction (sometimes referred to as peak output direction, output angle, peak output angle, light emission direction, etc.). The peak output direction may coincide with the longitudinal axis or may be slightly (e.g., within 20° of, within 15° of, within 10° of, within 5° of, etc.) offset relative to the longitudinal axis. For example, the peak output direction of a fiber may be offset relative to the longitudinal axis when the output face of the fiber is at a non-perpendicular angle relative to the longitudinal axis.

Image transport layer 80 and display layer 100 may be separated by distance 194. Distance 194 may be less than 500 microns, less than 100 microns, less than 50 microns, between 50 and 150 microns, between 50 and 500 microns, or any other desired distance.

The fibers may be bent at any desired bend angle and may have any desired maximum bend angle (e.g., 110°, 90°, 75°, etc.). The bend radius of the fibers may be selected to prevent excessive loss. In particular, the minimum bend radius of each fiber may be equal to ten times the radius of that fiber. This example is merely illustrative and may depend upon the tolerance for loss in a particular display. The minimum bend radius of each fiber may be equal to eight times the radius of the fiber, twelve times the radius of the fiber, five times the radius of the fiber, fifteen times the radius of the fiber, etc. The bend radius of each fiber may be greater than or equal to 50 microns, greater than or equal to 100 microns, greater than or equal to 25 microns, greater than or equal to 150 microns, greater than or equal to 200 microns, greater than or equal to 300 microns, greater than or equal to 400 microns, greater than or equal to 500 microns, etc.

Some of the fibers may have a uniform cross-sectional area whereas some of the fibers may have a varying cross-sectional area (e.g., some of the fibers may have a cross-sectional area at the input face that is different than the cross-sectional area at the output face). For example, fibers in the center of the image transport layer may have a cross-sectional area at the input face that is the same as the cross-sectional area at the output face. For example, the cross-sectional areas at the input face and output face may be within 5% of each other, within 10% of each other, within 1% of each other, etc. Fibers in the edge of the image transport layer may have a cross-sectional area at the input face that is less than the cross-sectional area at the output face. For example, the cross-sectional areas at the input face and output face may differ by more than 10%, more than 20%, more than 50%, more than 100%, etc. The shape of the cross-section of the fiber may also change along the length of the fiber. For example, at the input face the fiber may have a circular or hexagonal cross-section. At the output face the fiber may have a different cross-sectional shape (e.g., an oval, distorted hexagon, etc.).

The curved portion of output surface 92 may be considered an arc with a central angle of greater than 10°, greater than 25°, greater than 45°, greater than 60°, greater than 70°, greater than 80°, greater than 90°, between 45° and 90°, etc.

Figure 16:
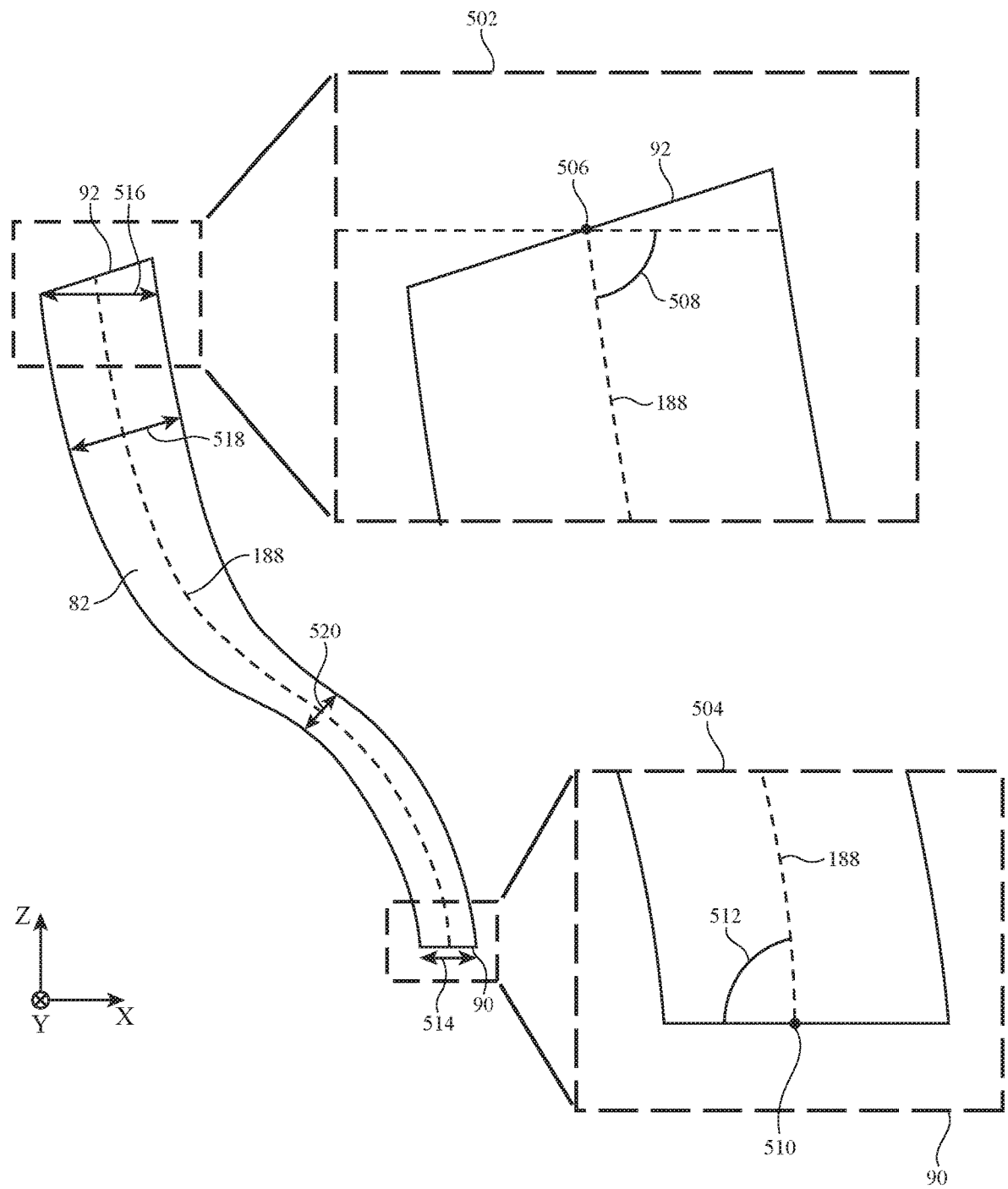
FIG. 16 is a cross-sectional side view of an illustrative fiber that may be used to form an image transport layer in accordance with an embodiment.

FIG. 16 is a cross-sectional side view of a fiber that may be incorporated into an image transport layer 80 (such as the image transport layer of FIG. 15). FIG. 16 shows additional properties that may be selected to control the emission of light by the fiber. As shown, fiber 82 has a longitudinal axis 188 (sometimes referred to as fiber axis 188 or fiber path 188) along which the fiber extends.

The fiber may have an input angle at input face 90 and an output angle at output face 92. Inset portions 502 and 504 show how the output angle and input angle may be defined. As shown in inset portion 502, longitudinal axis 188 may meet output face 92 at point 506. The output angle 508 may be measured as the angle between longitudinal axis 188 and a plane through point 506 that is parallel to the XY-plane. As shown in inset portion 504, longitudinal axis 188 may meet input face 90 at point 510. The input angle 512 may be measured as the angle between longitudinal axis 188 and a plane through point 510 that is parallel to the XY-plane. It should be understood that in general, the input angle and the output angle may be measured either clockwise from the XY-plane or counterclockwise from the XY-plane. The two resulting angles may be supplementary angles (that total) 180°. For simplicity, the lower of these two angles will be considered the input angle or output angle respectively. As an example, the input angle of FIG. 16 may be 85° when measured clockwise and 95° when measured counterclockwise. The input angle for fiber 82 in this scenario would be considered 85°.

Fiber 82 may have an input dimension 514 and an output dimension 516. The input dimension 514 is measured as the width (diameter) of fiber 82 at input face 90 in a plane that is parallel to the XY-plane. The output dimension 516 is measured as the width (diameter) of fiber 82 at output face 92 in a plane that is parallel to the XY-plane. Fiber 82 also has a maximum fiber diameter 518 and a minimum fiber diameter 520. The maximum fiber diameter 518 is the longest fiber diameter (e.g., the width of the fiber in a direction normal to fiber axis 188) that is present along the length of the fiber. The minimum fiber diameter 520 is the shortest fiber diameter (normal to fiber axis 188) that is present along the length of the fiber.

The dimensions of fiber 82 may affect the light emitted by the fiber. In particular, expansion ratio, compression ratio, and taper ratio may affect the profile of the emitted light from fiber 82. Expansion ratio may be defined as output dimension 516 divided by input dimension 514. Compression ratio may be defined as input dimension 514 divided by minimum diameter 520. Taper ratio may be defined as maximum diameter 518 divided by minimum diameter 520. These ratios may be controlled to ensure that light having a desired profile is emitted from the image transport layer.

The fibers of an image transport layer may have varying expansion ratios, compression ratios, and taper ratios. In some cases, the expansion ratio of every fiber in the image transport layer may less than 1.5, less than 1.4, less than 1.3, less than 1.2, or less than 1.1. The maximum expansion ratio of any fiber in the image transport layer may be between 1.2 and 1.5, between 1.2 and 1.4, between 1.1 and 1.5, or any other desired expansion ratio. The compression ratio of every fiber in the image transport layer may less than 3.0, less than 2.5, less than 2.0, less than 1.9, less than 1.8, less than 1.7, less than 1.5, less than 1.3, less than 1.2, or less than 1.1. The maximum compression ratio of any fiber in the image transport layer may be between 1.8 and 2.0, between 1.5 and 2.5, between 1.7 and 2.1, or any other desired expansion ratio. The taper ratio of every fiber in the image transport layer may less than 3.0, less than 2.5, less than 2.0, less than 2.2, less than 2.4, less than 2.3, less than 1.7, less than 1.5, less than 1.3, less than 1.2, or less than 1.1. The maximum taper ratio of any fiber in the image transport layer may be between 2.0 and 2.5, between 1.5 and 2.5, between 2.1 and 2.3, between 2.0 and 2.4, or any other desired taper ratio.

The input angles and output angles of each fiber may also be selected for a desired optical performance of the image transport layer. The input angle of every fiber in the image transport layer may be between 80° and 90°, may be between 70° and 90°, may be between 75° and 90°, may be between 85° and 90°, etc.

The output angles of the fibers in the image transport layer may be selected to provide output light of a desired profile. In some cases, as shown in FIG. 15, the output surface of the image transport layer may have planar central portion. The image transport layer may have a portion that forms some or all of the planar central portion of the output surface. The fibers in this portion of the image transport layer may not be bent (e.g., the fibers simply pass light vertically from the display layer to the output surface without laterally translating the location of the light). The portion of the image transport layer with fibers that are not bent may be referred to as an unformed region or unbent region of the image transport layer. In the unformed region of the image transport layer, the output angles of the fibers may be approximately 90°. The output angles of all of the fibers in the unformed region may be greater than 88°, greater than 89°, greater than 85°, greater than 89.5°, etc. The unformed region of the image transport layer may be surrounded by a region of the image transport layer in which the fibers are bent (sometimes referred to as a formed region or bent region). A top view of an image transport layer showing this arrangement is shown in FIG. 17.

Figure 17:
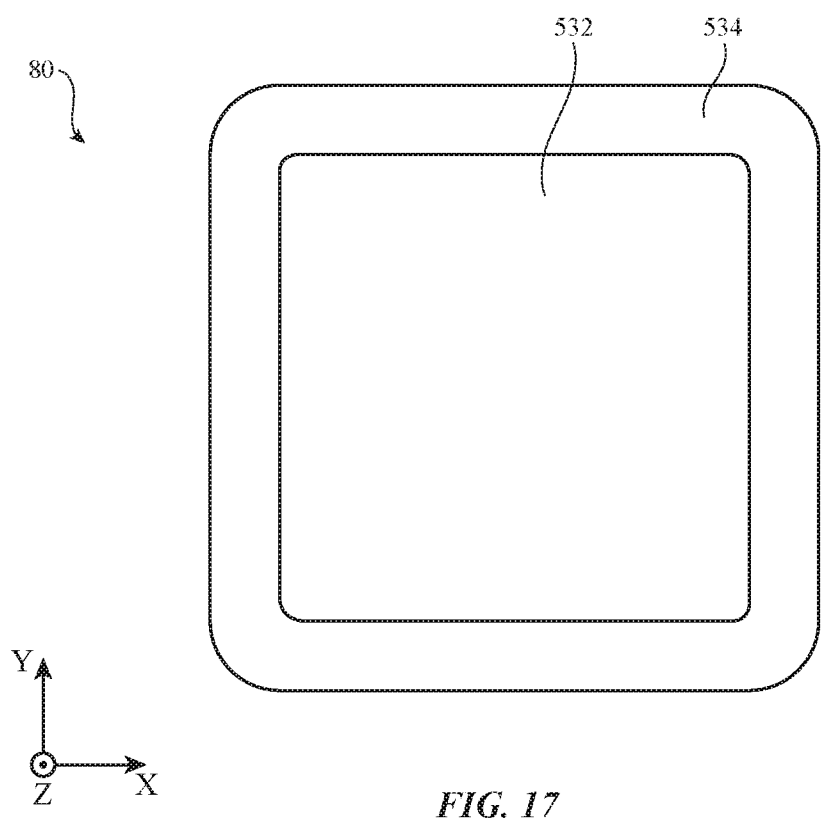
FIG. 17 is a top view of an illustrative image transport layer showing how an unformed region with vertical fibers may be surrounded by a formed region with bent fibers in accordance with an embodiment.

As shown in the top view of FIG. 17, image transport layer 80 may have an unformed region 532 and a formed region 534. As shown, unformed region 532 may form a central portion of the image transport layer. Fibers in unformed region 532 may not be bent and may extend vertically parallel to the Z-axis. The image transport layer may have a planar output surface in region 532. Region 534 may extend in a ring around region 532 (e.g., region 534 may laterally surround region 532). Region 534 may have fibers that are bent in order to hide an inactive border area of the display.

As shown in FIG. 17, the image transport may have a rectangular footprint with rounded corners when viewed from above. The rounded corners may be bent downwards (e.g., in the negative Z-direction away from the viewer and towards the display panel). The output surface of the image transport layer may have compound curvature in the rounded corner regions.

In the central region 532 of the image transport layer, the output angles of the fibers may be approximately 90°. However, in the peripheral region 534 of the image transport layer, the output angles of the fibers may not necessarily be equal to 90°. The output angles of the fibers in this region may affect the viewing performance of the display from different angles. For example, to optimize viewing in a direction parallel to the Z-axis (as shown by direction 110 in FIG. 15 for example), it may be desirable for the output angles of the fibers to be 90°. An example of this type (in which fibers in the formed region have output angles of approximately) 90° was shown in FIG. 15. However, the display may not always be viewed in a direction parallel to the Z-axis. Therefore, it may be desirable for the display to be viewable at different viewing angles relative to the Z-axis (e.g., a 30°, 45°, 60°, or 90° angle). To ensure satisfactory viewing in these types of scenarios, the output angles of one or more of the fibers in region 534 may be less than 90°.

Figure 18:
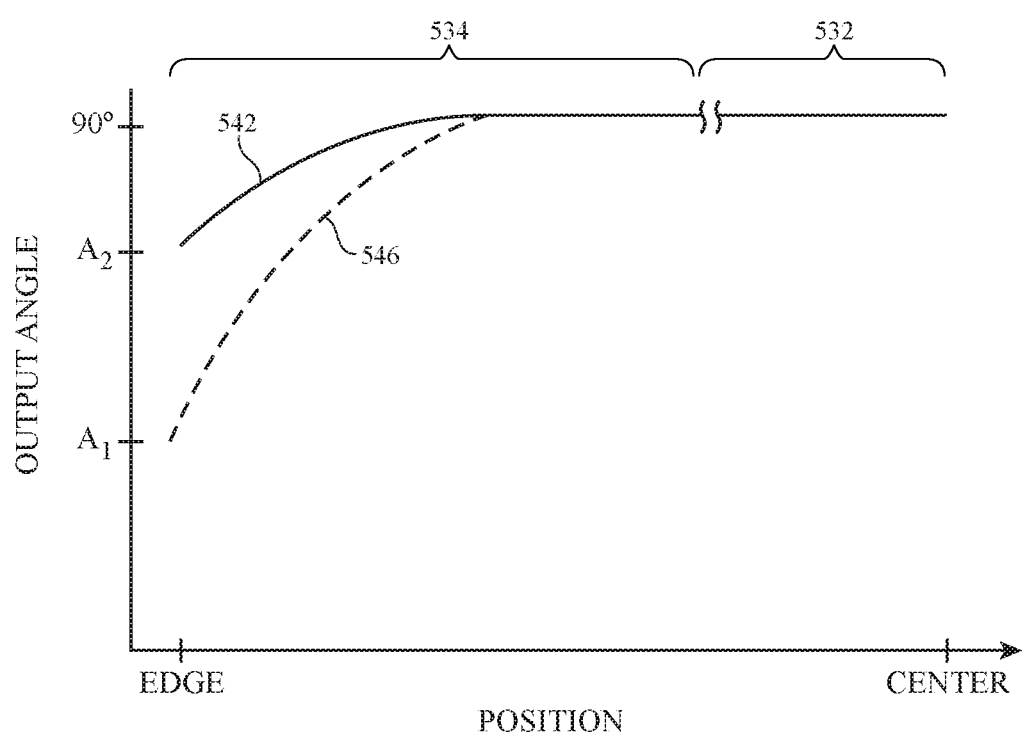
FIG. 18 is a graph showing illustrative profiles for fiber output angles as a function of position of the fibers in accordance with an embodiment.

FIG. 18 is a graph showing output angles of fibers as a function of the position of the fiber within the image transport layer. FIG. 18 shows how the output angle of the fibers may vary as the fibers approach the edge of the image transport layer. Profile 546 starts at output angle $A_1$ at the edge of the image transport layer and continuously and monotonically increases towards the center of the image transport layer. The output angles may remain (approximately) constant once a 90° output angle is reached. Profile 542 starts at output angle $A_2$ (that is greater than $A_1$) at the edge of the image transport layer and continuously and monotonically increases to 90°. These examples of output angle profiles for the fibers are merely illustrative. If desired, the profiles may have sections where the output angle decreases as the position moves towards the center of the image transport layer. Different minimum output angles as well as different profile shapes for the output angles may be used to optimize the optical performance of the image transport layer. The precise output angle profile selected by depend on the specific design requirements of the display (e.g., if off-axis viewing is prioritized, the minimum output angle will be lower than if off-axis viewing is not prioritized).

Angle $A_2$ for profile 542 may be between 70° and 80°, may be between 65° and 85°, may be between 73° and 77°, may be between 74° and 76°, may be greater than 70°, may be less than 80°, or may be any other desired angle. In profile 542, at a position one millimeter from the edge of the image transport layer the output angle may be between 75° and 85°, may be between 70° and 87°, may be between 78° and 85°, may be between 80° and 85°, may be between 81° and 82°, may be greater than 80°, may be less than 85°, or may be any other desired angle. In profile 542, at a position two millimeters from the edge of the image transport layer the output angle may be between 80° and 88°, may be between 82° and 87°, may be between 84° and 86°, may be between 85° and 86°, may be greater than 84°, may be less than 88°, or may be any other desired angle. In profile 542, at a position three millimeters from the edge of the image transport layer the output angle may be between 80° and 89.5°, may be between 82° and 89.9°, may be between 87° and 89°, may be between 88° and 89°, may be greater than 87°, may be less than 89°, or may be any other desired angle. In profile 542, at a position four millimeters from the edge of the image transport layer the output angle may be between 85° and 89.9°, may be between 87° and 89.9°, may be between 88° and 89.9°, may be between 89.0° and 89.9°, may be greater than 89.0°, may be less than 89.9°, or may be any other desired angle. In profile 542, at a position five millimeters from the edge of the image transport layer the output angle may 90° or may be any other desired angle. These values are merely illustrative and the output angles of profile 542 may have any desired values.

Angle $A_1$ for profile 546 may be between 35° and 70°, may be between 40° and 60°, may be between 40° and 50°, may be between 45° and 50°, may be between 44° and 48°, may be greater than 40°, may be less than 50°, or may be any other desired angle. In profile 546, at a position one millimeter from the edge of the image transport layer the output angle may be between 35° and 80°, may be between 50° and 70°, may be between 60° and 70°, may be between 65° and 70°, may be between 64° and 66°, may be greater than 60°, may be less than 70°, or may be any other desired angle. In profile 546, at a position two millimeters from the edge of the image transport layer the output angle may be between 70° and 85°, may be between 65° and 85°, may be between 77° and 83°, may be between 78° and 80°, may be greater than 75°, may be less than 85°, or may be any other desired angle. In profile 546, at a position three millimeters from the edge of the image transport layer the output angle may be between 80° and 88°, may be between 82° and 88°, may be between 85° and 87°, may be between 86° and 87°, may be greater than 84°, may be less than 88°, or may be any other desired angle. In profile 546, at a position four millimeters from the edge of the image transport layer the output angle may be between 85° and 89.9°, may be between 87° and 89.9°, may be between 88° and 89.9°, may be between 89.0° and 89.9°, may be greater than 89.0°, may be less than 89.9°, or may be any other desired angle. In profile 546, at a position five millimeters from the edge of the image transport layer the output angle may 90° or may be any other desired angle. These values are merely illustrative and the output angles of profile 546 may have any desired values.

Figure 19:
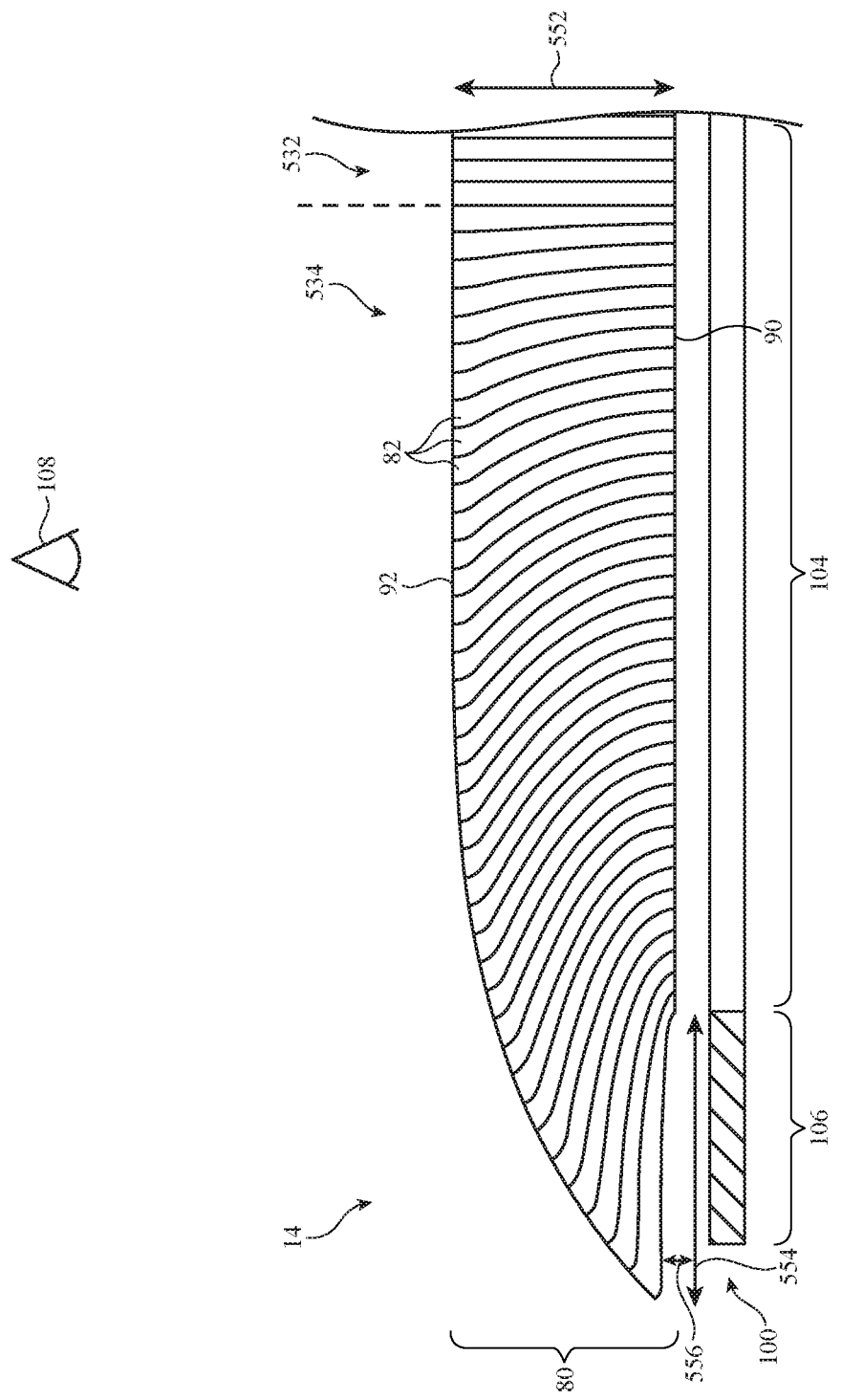
FIG. 19 is a cross-sectional side view of an illustrative image transport layer that includes fibers with output angles that vary as a function of position in accordance with an embodiment.

FIG. 19 is a cross-sectional side view of an illustrative display with an image transport layer 80 that transports image light from a display layer to a curved output surface that hides the inactive border area of the display layer. As shown in FIG. 19, output surface 92 is formed over inactive border area 106 of display layer 100. Image transport layer 80 uses light from the active area 104 to hide inactive border area 106. This arrangement provides a borderless appearance to display 14 when viewed by viewer 108 (because light is emitted across the entire display without any visible non-light-emitting portions).

In the example of FIG. 19, output surface 92 has a planar central portion over the active area and a curved portion that extends over the inactive border area. This example is merely illustrative. In general, output surface 92 may have any desired shape. For example, the output surface may be entirely curved. The portion of output surface 92 over active area 104 may have any desired combination of curved portions and planar portions. In another embodiment, the portion of output surface 92 over inactive border area 106 may be planar (forming an entirely planar output surface for example). The portion of output surface 92 over inactive border area 106 may have any desired combination of curved portions and planar portions.

As shown in FIG. 19, image transport layer includes portion 532 with fibers that are not bent and portion 534 with fibers that are bent. The output angle of the fibers in region 534 may gradually decrease as the fibers approach the edge of the image transport layer according to profile 542 in FIG. 18, profile 546 in FIG. 18, or another desired profile. The thickness 552 of the image transport layer may be greater than 0.5 millimeters, greater than 1.0 millimeter, greater than 1.5 millimeters, greater than 2.0 millimeters, less than 5.0 millimeters, less than 3.0 millimeters, less than 2.0 millimeters, less than 1.5 millimeters, between 1.2 and 1.6 millimeters, between 1.3 and 1.5 millimeters, between 1.3 and 1.4 millimeters, or any other desired thickness.

Distance 554 may be a measure of the largest distance that light is translated in the XY-plane by a fiber in the image transport layer. Distance 554 may sometimes be referred to as the border hiding dimension. Distance 554 may be greater than 1.5 millimeters, greater than 1.0 millimeters, greater than 0.5 millimeters, greater than 2.0 millimeters, greater than 5.0 millimeters, less than 1.5 millimeters, less than 1.0 millimeters, less than 0.5 millimeters, less than 2.0 millimeters, less than 5.0 millimeters, between 1.0 and 2.0 millimeters, between 1.5 and 2.0 millimeters, between 1.7 and 1.8 millimeters, or any other desired distance. Distance 556 may measure the step height between input face 90 of the image transport layer and the surface of the edge-most fiber in the image transport layer. This step height may be the product of a peripheral groove in the image transport layer (e.g., peripheral groove 98 as in FIG. 10). Distance 556 may be less than 0.5 millimeters, less than 0.1 millimeters, less than 0.05 millimeters, greater than 0.5 millimeters, greater than 0.1 millimeters, greater than 0.05 millimeters, greater than 0.03 millimeters, greater than 0.01 millimeters, between 0.01 millimeters and 0.1 millimeters, between 0.03 millimeters and 0.08 millimeters, etc.

The bend radius of each fiber in the image transport layer of FIG. 19 may be greater than or equal to 50 microns, greater than or equal to 100 microns, greater than or equal to 25 microns, greater than or equal to 150 microns, greater than or equal to 200 microns, greater than or equal to 300 microns, greater than or equal to 400 microns, greater than or equal to 500 microns, etc. The expansion ratio of each fiber in the image transport layer of FIG. 19 may be less than 1.3. The image transport layer may have fibers with an expansion ratio of at least 1.1, at least 1.2, etc. The compression ratio of each fiber in the image transport layer of FIG. 19 may be less than 1.9. The image transport layer may have fibers with a compression ratio of at least 1.2, at least 1.4, at least 1.5, at least 1.7, etc. The taper ratio of each fiber in the image transport layer of FIG. 19 may be less than 2.2. The image transport layer may have fibers with a taper ratio of at least 1.2, at least 1.4, at least 1.6, at least 1.8, at least 2.0, etc. The luminance of the display in formed region 532 of the image transport layer may be uniform (e.g., with less than 5% luminance variation) for all viewing angles (e.g., from a viewing angle parallel to the Z-axis to a viewing angle that is at an 80° angle with respect to the Z-axis). The bent fibers may have a circular cross-sectional shape at the input face and an elliptical cross-sectional shape at the output face. The fibers that are not bent may have a circular cross-sectional shape at the input face and a circular cross-sectional shape at the output face. The off-state diffuse reflectance of the image transport layer in unformed region 532 may be less than 2.0% (e.g., less than 2.0% of light reflects from the output surface of the image transport layer when the display is in an off state), less than 1.0%, less than 0.6%, less than 0.4%, or another desired reflectance. The off-state diffuse reflectance of the image transport layer in formed region 534 may be less than 2.0%, less than 1.5%, less than 1.0%, less than 0.8%, or another desired reflectance.

There are numerous possible methods to form image transport layers of the types shown herein. FIGS. 20A-20D show how a plurality of fibers may be grouped together into canes to eventually form an image transport layer. As shown in the perspective view of FIG. 20A, individual fibers 82 with a core surrounded by cladding 86 may first be formed. Each fiber may be formed by drawing a thin strand of transparent material (e.g., glass or polymer). Next, the fibers may be grouped together as shown in the top view of FIG. 20B. Additional material (e.g., optional binder 88) may be included in image transport layer 80 (e.g., to hold fibers 82 in place, etc.). Binder 88 may be formed from a material (e.g., polymer or glass) with a refractive index lower than that of cores 84 and/or lower than that of cladding 86 to promote total internal reflection in cores 84.

Figure 20A:
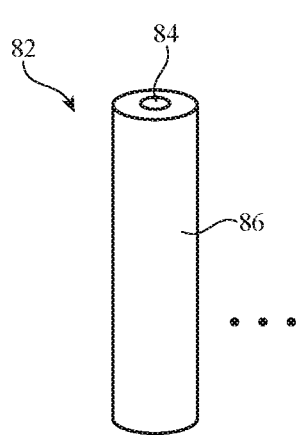
FIG. 20A is a perspective view of an illustrative fiber that may be used to form an image transport layer in accordance with an embodiment.
Figure 20B:
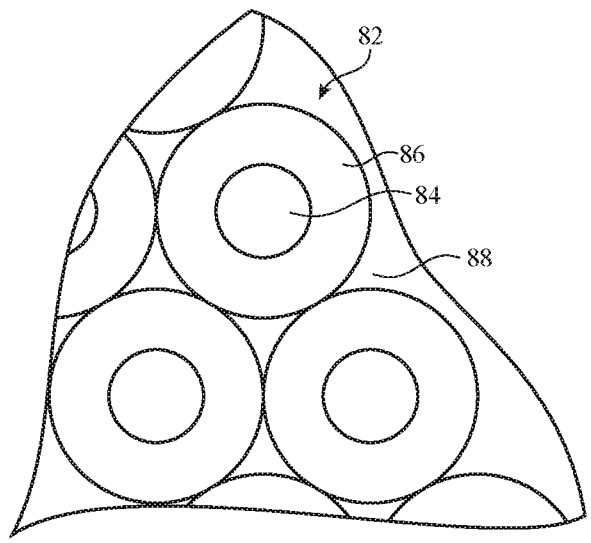
FIG. 20B is a top view of illustrative fibers grouped together into a cane in accordance with an embodiment.
Figure 20C:
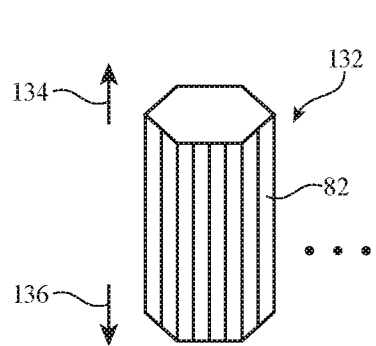
FIG. 20C is a perspective view of an illustrative cane of fibers in accordance with an embodiment.
Figure 20D:
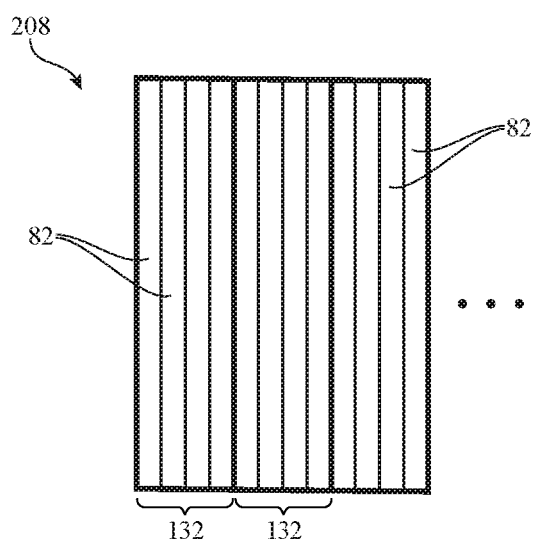
FIG. 20D is a cross-sectional side view of an illustrative fiber bundle that includes a plurality of canes of fibers in accordance with an embodiment.

The fibers may be grouped together into canes. Each cane includes a plurality of fibers 82 as shown in the perspective view of FIG. 20C. In FIG. 20C, cane 132 has a hexagonal shape. This example is merely illustrative, and each cane may have any desired cross-sectional shape. Cane 132 includes multiple fibers and may sometimes be referred to as a cluster, group, tile, or set, of fibers. This example is merely illustrative, and each cane may have any desired shape. The canes may then be drawn by pulling on opposing sides (e.g., stretching) of the cane. For example, a force may be applied in direction 134 to a first side of the cane and a force may be applied in direction 136 to a second, opposing side of the cane. The fibers in the cane may become thinner when stretched in this manner. The fibers in the cane may be heated while being stretched. For example, the fibers in the cane may be heated to a temperature higher than the transition temperature but lower than the melting point of the fibers or another desired temperature. The fibers in the cane may also be attached together. For example, before or during stretching an adhesive material (e.g., binder 88) may be formed between the fibers in the cane and/or a combination of heat and pressure may attach the fibers in the cane together. Next, as shown in the cross-sectional side view of FIG. 20D, multiple canes may be grouped together to form a fiber bundle 208 (sometimes referred to as coherent fiber bundle 208, group of fibers 208, layer of fibers 208, etc.).

In some cases, polymer fibers used to form fiber bundle 208 may be cured during the manufacturing process. For example, the fibers may be exposed to heat or ultraviolet light, causing cross-linking polymerization. Electron-beam curing, exposure to a chemical catalyst, or exposure to another desired type of electromagnetic radiation may also be used to cure fibers for a fiber bundle. The curing may occur at any desired point during processing of the fibers to form a fiber bundle (and later an image transport layer). In one illustrative example, a fiber may be held in a particular shape. The fiber may then be cured (e.g., using electron-beam curing) to maintain the shape of the fiber.

Additional steps may be taken to form an image transport layer using fiber bundle 208. Swelling, slumping, and piping are examples of techniques that may be used to form an image transport layer that conveys light from the active area of a display layer over the inactive border area of the display layer.

Figure 21:
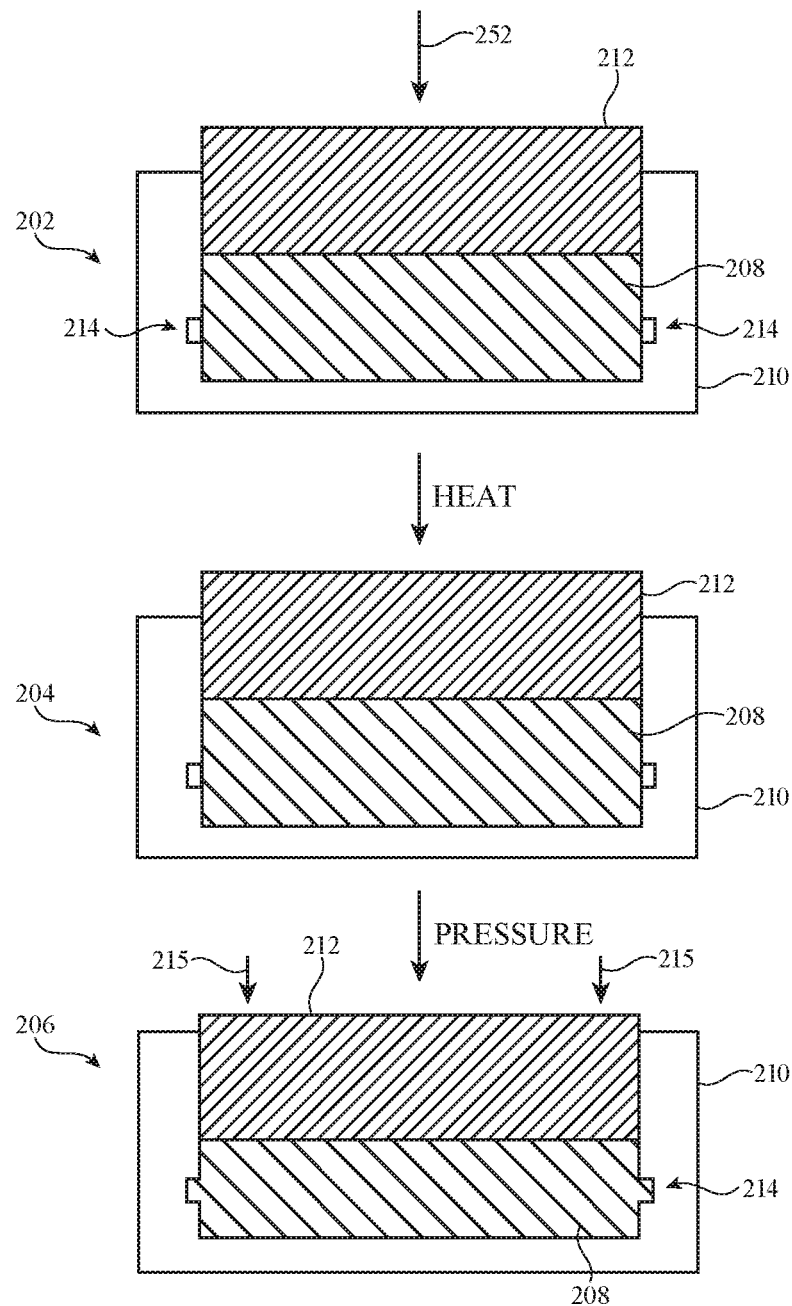
FIGS. 21 and 22 are flowcharts showing an illustrative method for forming an image transport layer using swelling in accordance with an embodiment.

FIG. 21 is a flowchart showing an illustrative method for forming an image transport layer using swelling. At step 202, a coherent fiber bundle 208 is placed in mold 210 with an overlying press 212. The mold has openings 214 on either side of the coherent fiber bundle. Mold 210 may have first and second (left and right) opposing walls (that each have a respective opening 214). The mold may have a third (lower) wall that connects the first and second walls. Alternatively, press 212 may press coherent fiber bundle from both the top and bottom and the mold may be ring-shaped to allow for the press to apply pressure to the coherent fiber bundle from two sides. Mold 210 may sometimes be described as U-shaped (when the lower wall of the mold is present). Coherent fiber bundle 208 may be placed in mold 210 such that the fibers in the coherent fiber bundle extend parallel to the left and right walls of the mold.

When viewed from above (e.g., looking in direction 252), mold 210 may have any suitable footprint. For example, mold 210 may have a footprint similar to the footprint of the display as shown in FIG. 2. The outline of the mold when viewed from above may be a rectangular outline with rounded corners. Opening 214 may extend in a ring around the mold (e.g., around the footprint of the mold).

At step 204, fiber bundle 208 is heated. The fiber bundle may be heated to any desired temperature (e.g., greater than 100° C., greater than 125° C., greater than 150° C., greater than 175° C., greater than 200° C., between 125° C. and 200° C., between 150° and 200° C., between 170° C. and 180° C., between 140° and 160° C., greater than 50° C., greater than 300° C., less than 250° C., less than 200° C., less than 175° C., less than 130° C., etc.). The fiber bundle may be heated using an oven, a thermal jacket, or any other desired heating mechanism. The temperature may vary over time or may be constant. The heat may be applied for any desired length of time.

At step 206, press 212 may be biased in direction 215 to apply pressure to coherent fiber bundle 208 (e.g., while the coherent fiber bundle is still at the elevated temperature from step 204). Applying pressure to the coherent fiber bundle 208 helps force fibers to enter openings 214 of mold 210. Thermal expansion due to the applied heat may also cause the fibers to enter openings 214 of mold 210. This may be referred to as swelling of the coherent fiber bundle. A vacuum may optionally be drawn in openings 214 to help draw the coherent fiber bundle into the openings. Any desired amount of force may be applied in direction 215 to force fibers of fiber bundle 208 into openings 214 (e.g., more than 200 N, less than 500 N, between 300 N and 500 N, between 350 N and 450N, more than 100 N, less than 750 N, more than 50 N, between 50 N and 150 N, between 75 N and 125 N, between 100 N and 200 N, etc.). The applied force may vary over time or may be constant. The applied force may be applied for any desired length of time.

Once fibers from coherent fiber bundle 208 fill openings 214, the coherent fiber bundle may be cooled so that the coherent fiber bundle maintains the newly molded shape. One or more final image transport layers may be cut from the shaped coherent fiber bundle.

Figure 22:
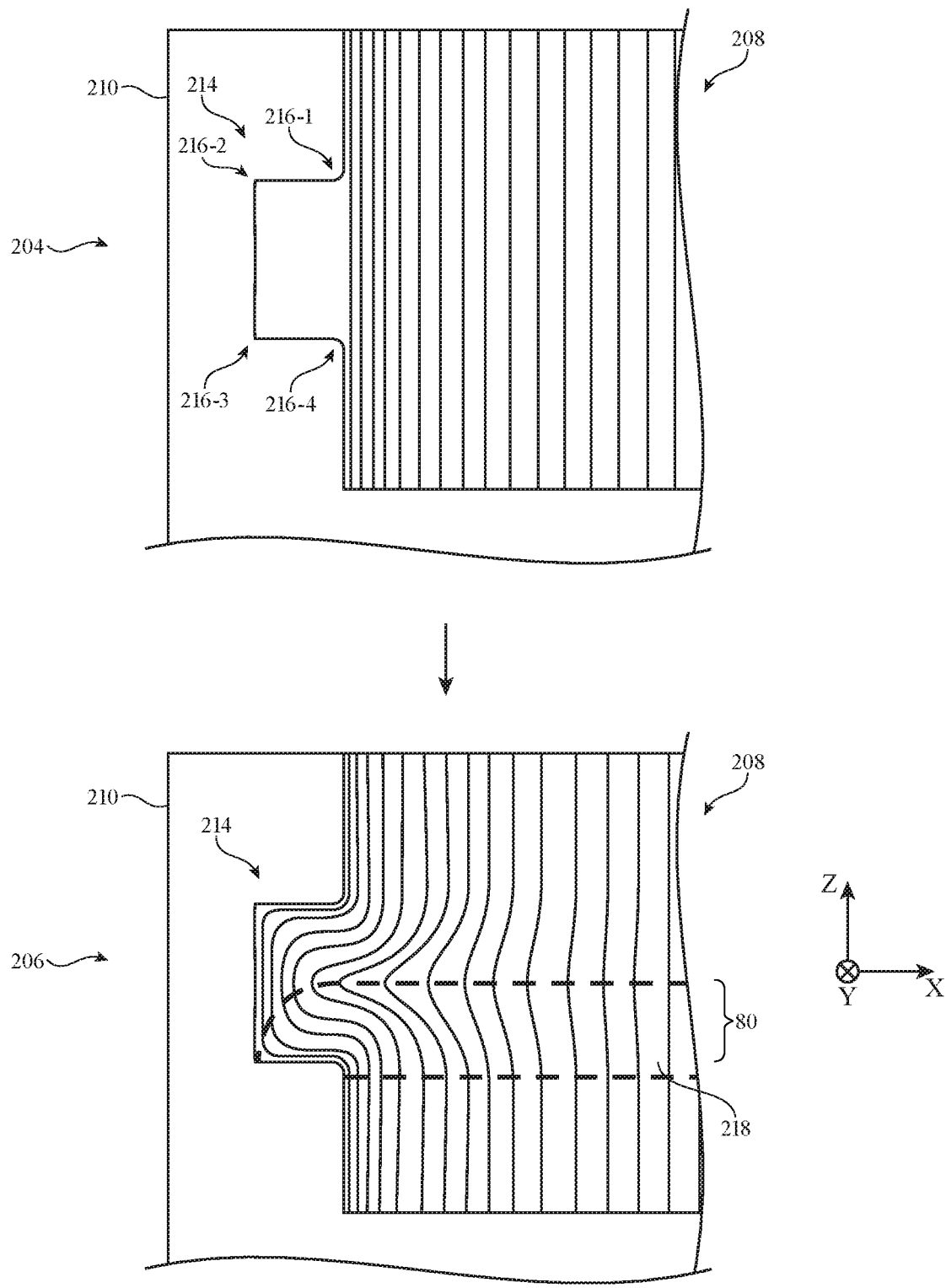

FIG. 22 is a flowchart showing a close-up view of steps 204 and 206 with fibers of coherent fiber bundle 208 being drawn into opening 214. As shown in FIG. 22, at step 204 coherent fiber bundle 208 may be adjacent to mold 210 (without any portions in opening 214). Opening 214 may have four turns (216-1, 216-2, 216-3 and 216-4). Each of turns 216-1, 216-2, 216-3, and 216-4 may be rounded if desired (or may be formed by right angles). For example, turns 216-1 and 216-4 in FIG. 22 are rounded. Because opening 214 has four turns, mold 210 may sometimes be referred to as a quadruple turn mold.

FIG. 22 also depicts how the fiber width may vary as function of position across the fiber bundle. For example, fibers closer to the edge of the bundle may have a smaller width than fibers closer to the center of the bundle. In one example, fibers in a central area of the bundle may have all have a first width and fibers in an edge portion of the bundle may all have a second width that is different (e.g., smaller) than the first width. Alternatively, there may be a gradient in width between different portions of the bundle. For example, fibers in a central area of the bundle may all have a first width. The fibers may then gradually transition between the first width and a second width that is different than (e.g., smaller than) the first width as the fibers approach the edge of the bundle. The gradient may continue up to the edge of the fiber bundle. Alternatively, fibers within some fixed distance from the edge of the bundle may all have a uniform second width and the width gradient is contained to the fibers between the central portion and the fibers within the fixed distance from the edge. In yet another example, the fiber width may be uniform across the display. As previously discussed, the shape and size of the cross-sectional area of each fiber may vary between the input surface of the image transport layer and the output surface of the image transport layer. Therefore, the width pattern of the fibers may be different at the input surface of the image transport layer compared to the output surface of the image transport layer. For example, at the input surface the fibers may have a smaller width closer to the edge of the bundle than in the center of the bundle. Yet, at the output surface the fibers may have a uniform width across the bundle. In general, any of the aforementioned width patterns may be independently applied to either the input surface or output surface of the coherent fiber bundle. These examples are merely illustrative and fibers may have any desired width pattern across the fiber bundle.

The fiber pitch (e.g., the distance from the center of a fiber to the center of the adjacent fiber) may also vary as function of position across the fiber bundle (as shown in FIG. 22). For example, fibers closer to the edge of the bundle may have a smaller pitch than fibers closer to the center of the bundle. In one example, fibers in a central area of the bundle may have all have a first pitch and fibers in an edge portion of the bundle may all have a second pitch that is different (e.g., smaller) than the first pitch. Alternatively, there may be a gradient in pitch between different portions of the bundle. For example, fibers in a central area of the bundle may all have a first pitch. The fibers may then gradually transition between the first pitch and a second pitch that is different than (e.g., smaller than) the first pitch as the fibers approach the edge of the bundle. The gradient may continue up to the edge of the fiber bundle. Alternatively, fibers within some fixed distance from the edge of the bundle may all have a uniform second pitch and the pitch gradient is contained to the fibers between the central portion and the fibers within the fixed distance from the edge. In yet another example, the fiber pitch may be uniform across the display. As previously discussed, the shape and size of the cross-sectional area of each fiber may vary between the input surface of the image transport layer and the output surface of the image transport layer. Therefore, the pitch pattern of the fibers may be different at the input surface of the image transport layer compared to the output surface of the image transport layer. For example, at the input surface the fibers may have a smaller pitch closer to the edge of the bundle than in the center of the bundle. Yet, at the output surface the fibers may have a uniform pitch across the bundle. In general, any of the aforementioned pitch patterns may be independently applied to either the input surface or output surface of the coherent fiber bundle. These examples are merely illustrative and fibers may have any desired pitch pattern across the fiber bundle.

FIG. 22 also shows the fibers of coherent fiber bundle 208 being forced into opening 214 in mold 210 at step 206. After the fibers fill and conform to the shape of opening 214, an image transport layer 80 may be cut from the coherent fiber bundle (e.g., by cutting along dashed line 218). The image transport layer may be cut to have any desired three-dimensional output surface. The quadruple turn mold shown in FIGS. 21 and 22 may be shaped to ensure that light is ultimately emitted from the fibers with a desired luminance profile.

After filling opening 214, coherent fiber bundle 208 may be symmetric about the XY-plane in FIG. 22. Therefore, a second image transport layer may be cut from the coherent fiber bundle (e.g., by cutting along a pattern that is the opposite of dashed line 218).

The example of a shape for mold 210 having opening 214 in FIG. 22 is merely illustrative. In general, mold 210 may have any desired shape with any desired number of openings. The shape of mold 210 and opening 214 may influence the output angle of light from the fibers. Additional examples of molds are shown in FIGS. 23 and 24.

Figure 23:
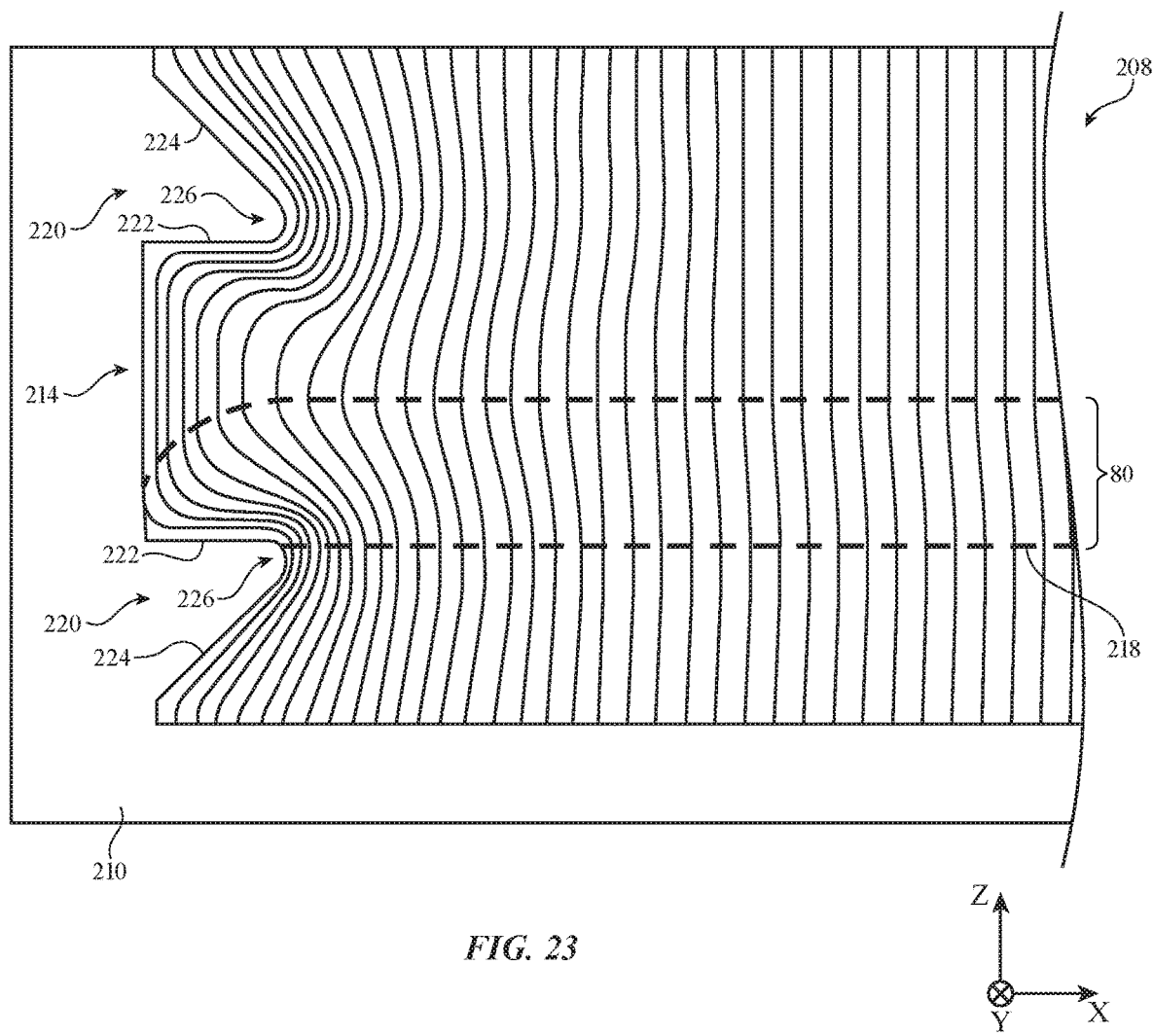
FIGS. 23 and 24 are cross-sectional side views of illustrative molds that may be used to form an image transport layer using swelling in accordance with an embodiment.

In FIG. 23, mold 210 has an opening 214 (similar to as in FIG. 22). However, in FIG. 19 opening 214 is defined by protrusions 220. Each protrusion 220 has a first surface 222 that is joined to a second surface 224 by turn 226. Surface 222 may be orthogonal to the left wall of the mold. In other words, surface 222 is perpendicular to the Z-axis and parallel to the X-axis in FIG. 23. Surface 222 may be parallel to an upper surface of coherent fiber bundle 208. Surface 224 may be at a non-perpendicular/non-zero angle relative to the upper surface of the coherent fiber bundle and the left wall of the mold. The angle between surfaces 222 and 224 may be between 30° and 60°, between 20° and 70°, between 10° and 80°, less than 85°, less than 60°, less than 30°, greater than 5°, greater than 25°, greater than 45°, greater than 70°, etc. Turn 226 between surfaces 222 and 224 may be rounded (as in FIG. 23) or may not be rounded (e.g., there may be a vertex between surfaces 222 and 224).

FIG. 23 shows how (as discussed in connection with FIG. 22) an image transport layer 80 may be cut from the coherent fiber bundle (e.g., by cutting along dashed line 218). The shape of the mold in FIG. 23 may help shape the fibers to have output angles of a desired profile.

Figure 24:
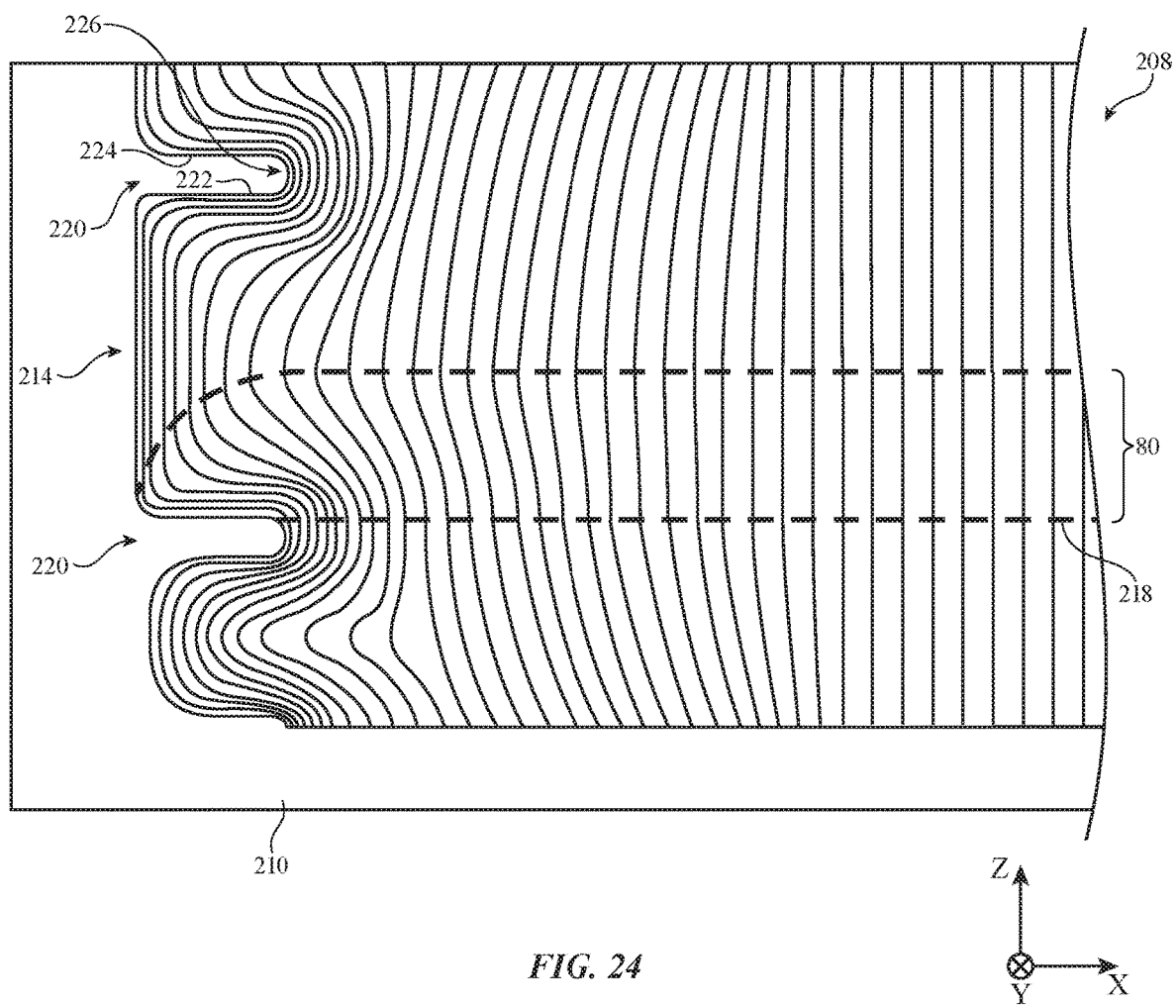

In FIG. 24, mold 210 has an opening 214 defined by protrusions 220 (similar to as in FIG. 23). However, in FIG. 24 protrusions 220 have a different shape than in FIG. 23. Each protrusion 220 in FIG. 24 has a first surface 222 that is joined to a second surface 224 by turn 226. Surface 222 may be orthogonal to the left wall of the mold. In other words, surface 222 is perpendicular to the Z-axis and parallel to the X-axis in FIG. 24. Surface 222 may be parallel to an upper surface of coherent fiber bundle 208. Similarly, surface 224 may be orthogonal to the left wall of the mold. In other words, surface 224 is perpendicular to the Z-axis and parallel to the X-axis in FIG. 24. Surface 224 may be parallel to an upper surface of coherent fiber bundle 108. Surfaces 222 and 224 may be parallel or close to parallel (e.g., within 5° of parallel, within 10° of parallel, etc.). In FIG. 24, turn 226 between surfaces 222 and 224 is depicted as being a continuous rounded turn. This example is merely illustrative. Alternatively, two right-angled turns maybe connect surfaces 222 and 224 or two rounded turns with an intervening straight surface may be interposed between surfaces 222 and 224.

FIG. 24 also shows how (as discussed in connection with FIG. 22) an image transport layer 80 may be cut from the coherent fiber bundle (e.g., by cutting along dashed line 218). The shape of the mold in FIG. 24 may help shape the fibers such that light is output from the image transport layer in a desired manner.

In FIGS. 21-24, a method is shown where a press with a planar surface pushes on upper and lower surfaces of the coherent fiber bundle, forcing the sides of the coherent fiber bundle to conform to the shape of a mold. However, this is merely one option for using swelling to form image transport layers. In another possible method for forming image transport layers, a press with surface features may be pushed into the sides of the coherent fiber bundle. An arrangement of this type is shown in FIG. 25.

Figure 25:
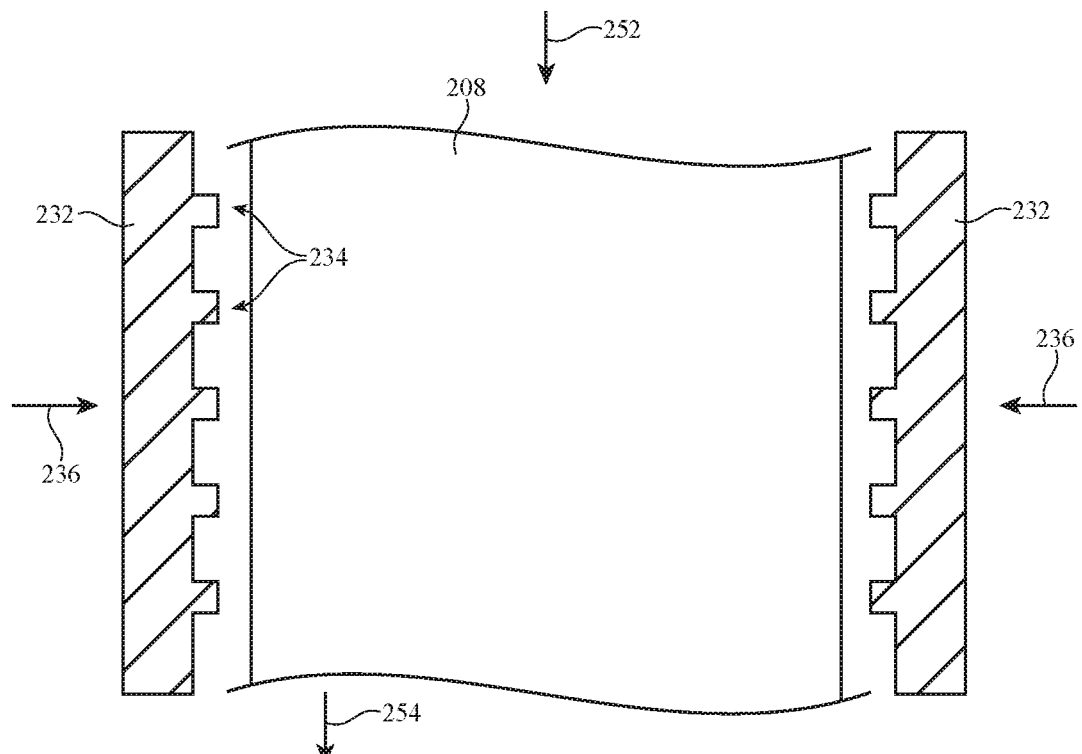
FIG. 25 is a cross-sectional side view of an illustrative method for forming image transport layers showing how a stamping press may be pressed into a fiber bundle in accordance with an embodiment.

FIG. 25 is a cross-sectional side view of an illustrative method for forming image transport layers using a stamping tool. As shown in FIG. 25, coherent fiber bundle 208 may be interposed between different portions of stamping tool 232 (sometimes referred to as stamping press 232, pressing tool 232, or press 232). Stamping tool 232 has a plurality of protrusions 234. To form image transport layers from the coherent fiber bundle, stamping press 232 may apply force towards the coherent fiber bundle (e.g., along arrows 236).

Figure 26:
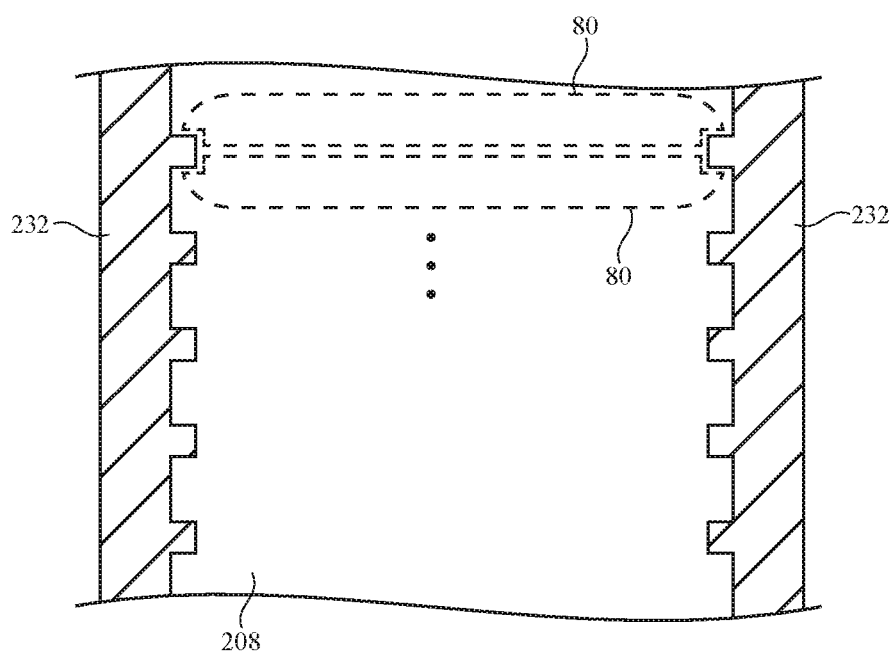
FIG. 26 is a cross-sectional side view showing the illustrative stamping press of FIG. 25 while the stamping press is pressed into the fiber bundle in accordance with an embodiment.

FIG. 26 is a cross-sectional side view of the coherent fiber bundle and stamping press of FIG. 25 after the stamping press has been pressed into the sides of the coherent fiber bundle. Heat may also be applied to the coherent fiber bundle during the stamping process. The coherent fiber bundle may be heated to any desired temperature (e.g., greater than 100° C., greater than 125° C., greater than 150° C., greater than 175° C., greater than 200° C., between 125° C. and 200° C., between 150° and 200° C., between 170° C. and 180° C., between 140° and 160° C., greater than 50° C., greater than 300° C., less than 250° C., less than 200° C., less than 175° C., less than 130° C., etc.). As shown in FIG. 26, after the coherent fiber bundle has been stamped by press 232, the coherent fiber bundle may conform to the shape of press 232. One or more image transport layers 80 may then be cut from the fiber bundle as shown by the dashed lines in FIG. 22.

In the cross-sectional side view of FIGS. 25 and 26, stamping press 232 is depicted on the left and right sides of the coherent fiber bundle. However, when viewed from above (e.g., looking in direction 252 in FIG. 25), press 232 may have any suitable footprint. For example, press 232 may have a footprint similar to the footprint of the display as shown in FIG. 2. The outline of the print when viewed from above may be a rectangular outline with rounded corners. Press 232 may extend in a ring around the coherent fiber bundle.

The method shown in FIGS. 25 and 26 may allow for faster manufacturing of image transport layers at a large scale. In FIGS. 21-24, one image transport layer is formed at a time (e.g., in a batch processing procedure). A mold may be developed that can form multiple image transport layers at a time (e.g., a mold with multiple recesses), but this method is still not conducive to continuous manufacturing. In FIGS. 25 and 26, the stamping press may have any desired number of protrusions to allow forming of any desired number of image transport layers with each stamp. Additionally, the coherent fiber bundle may continuously move between the stamping press (e.g. in direction 254 in FIG. 25). The stamping press may intermittently be pressed into the coherent fiber bundle, continuously forming a plurality of image transport layers with each stamp. The method of FIGS. 25 and 26 may therefore allow for fast and large-scale manufacturing of image transport layers.

Figure 27:
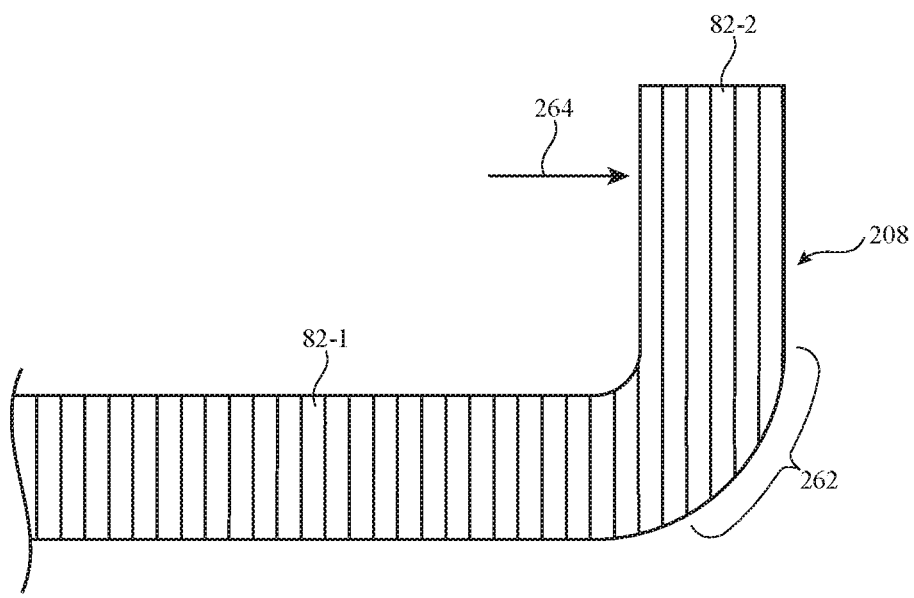
FIG. 27 is a cross-sectional side view showing an illustrative pre-cut fiber bundle that may be bent to form an image transport layer in accordance with an embodiment.

FIGS. 21-26 show methods for forming image transport layers that rely on swelling to manipulate the fibers in the fiber bundle. FIG. 27 is a cross-sectional side view of a fiber bundle showing how piping may be used to form an image transport layer. As shown in FIG. 27, coherent fiber bundle 208 may be pre-cut to have parallel fibers having different lengths. For example, fiber 82-1 has a first length and fiber 82-2 has a second length that is greater than the first length. The fibers may have lengths that vary in any desired manner. In FIG. 27, the fibers are shaped to have a bent portion 262. In bent portion 262, the fibers themselves are not bent, but the lengths of the fibers vary to form the bent portion in the bundle as shown. The fiber bundle 208 in FIG. 27 may be cut from a larger fiber bundle into the shape shown.

Figure 28:
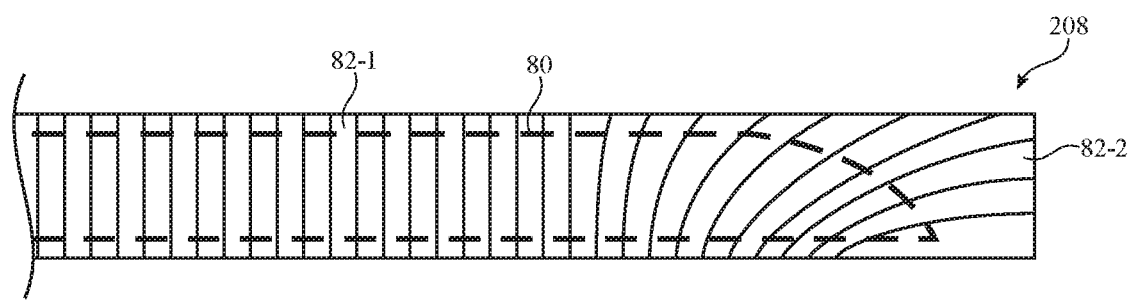
FIG. 28 is a cross-sectional side view showing the fiber bundle of FIG. 27 after the fiber bundle has been bent in accordance with an embodiment.

Next, to form an image transport layer, a bias force may be applied in direction 264. Heat may optionally be applied to the coherent fiber bundle during the bending process. The coherent fiber bundle may be heated to any desired temperature (e.g., greater than 100° C., greater than 125° C., greater than 150° C., greater than 175° C., greater than 200° C., between 125° C. and 200° C., between 150° and 200° C., between 170° C. and 180° C., between 140° and 160° C., greater than 50° C., greater than 300° C., less than 250° C., less than 200° C., less than 175° C., less than 130° C., etc.). The resulting coherent fiber bundle is shown in the cross-sectional side view of FIG. 28. As shown, by applying the bias force in direction 264, the coherent fiber bundle is flattened into a bundle having planar and parallel upper and lower surfaces. Some of the individual fibers may be bent. Fiber 82-1 (e.g., in a central portion of the coherent fiber bundle) may not be bent. Fiber 82-2 (e.g., in a peripheral portion of the coherent fiber bundle), however, is bent as shown in FIG. 28. The bent fibers in the peripheral portion of the coherent fiber bundle may therefore be used to hide an inactive border region of a display when used in an image transport layer. FIG. 28 also shows how an image transport layer 80 may be cut from the resulting fiber bundle.

Figure 29:
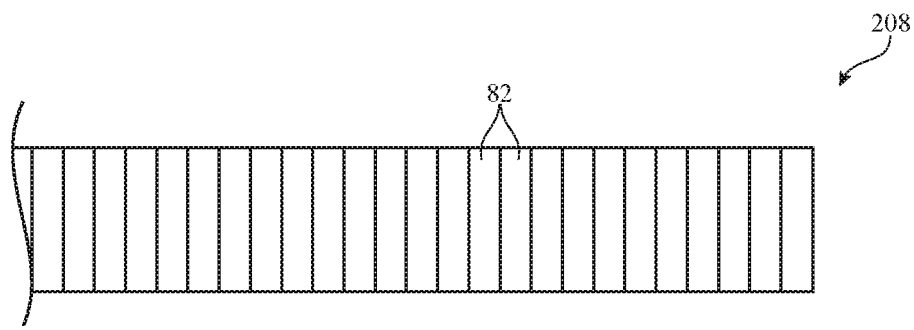
FIG. 29 is a cross-sectional side view showing an illustrative fiber bundle that may be heated to form an image transport layer using slumping in accordance with an embodiment.

FIG. 29 is a cross-sectional side view of a coherent fiber bundle showing how slumping may be used to form an image transport layer. As shown in FIG. 29, coherent fiber bundle 208 may initially have a plurality of unbent, parallel fibers 82 having a uniform length. The coherent fiber bundle has a planar upper surface and a planar lower surface. This coherent fiber bundle may be heated to cause the coherent fiber bundle to slump. During slumping, heat and gravity are used to shape the coherent fiber bundle in a desired manner. The coherent fiber bundle may be heated to a temperature higher than the transition temperature but lower than the melting point of the fibers or another desired temperature (e.g., a temperature that allows the coherent fiber bundle to be deformed by gravity). The coherent fiber bundle may be heated to a temperature of greater than 100° C., greater than 125° C., greater than 150° C., greater than 175° C., greater than 200° C., between 125° C. and 200° C., between 150° and 200° C., between 170° C. and 180° C., between 140° and 160° C., greater than 50° C., greater than 300° C., less than 250° C., less than 200° C., less than 175° C., less than 130° C., etc.

Figure 30:
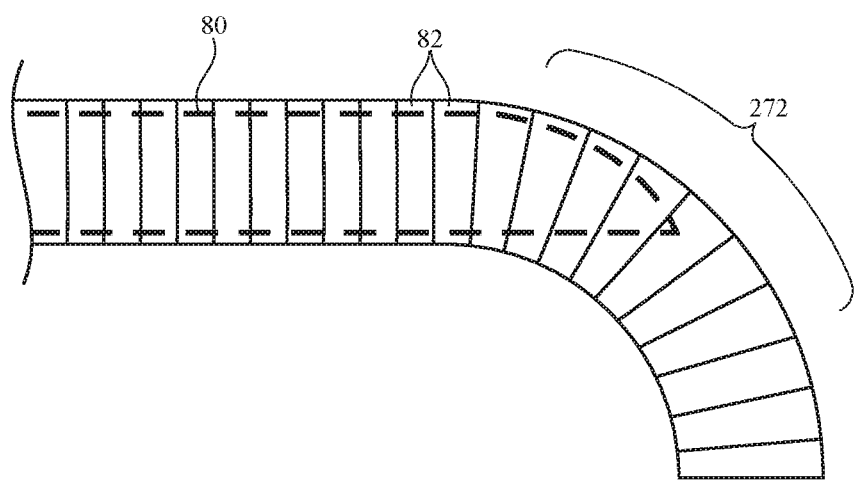
FIG. 30 is a cross-sectional side view showing the fiber bundle of FIG. 29 after slumping in accordance with an embodiment.

FIG. 30 is a cross-sectional side view of the coherent fiber bundle after the slumping is complete. As shown, the coherent fiber bundle has a bent portion 272. Bent portion 272 may be bent by gravity during the slumping process. An additional bias force may optionally be applied to the fiber bundle to help bend the fiber bundle. An underlying mold may be used to determine the shape of the coherent fiber bundle after slumping (e.g., the lower surface of the coherent fiber bundle may conform to an upper surface of an underlying mold). As shown in FIG. 30, after slumping, the fibers 82 may still be unbent (e.g., the fibers extend along a longitudinal axis that does not curve). However, the fibers in portion 272 of the coherent fiber bundle may be angled relative to the planar lower surface in the central portion of the coherent fiber bundle. The fibers in the peripheral portion of the coherent fiber bundle may therefore be used to hide an inactive border region of a display when used in an image transport layer. FIG. 30 also shows how an image transport layer 80 may be cut from the fiber bundle.

The examples of using swelling (as in FIGS. 21-26), piping (as in FIGS. 27 and 28), and slumping (as in FIGS. 29 and 30) to manipulate a fiber bundle to form one or more image transport layers are merely illustrative. In some embodiments, a combination of one or more of these techniques may be used to manipulate the fiber bundle. For example, swelling and slumping may both be used to form an image transport layer. First, a swelling process such as the swelling process shown in FIG. 22 may be performed (with fibers of the fiber bundle expanding into a recess of a mold). Then, a slumping process may be performed by applying heat and pressure to the fibers that entered the recess (e.g., the fibers that protrude away from the side of the fiber bundle). Fibers in a fiber bundle may also be formed using three-dimensional (3D) printing techniques if desired.

As previously discussed in connection with FIGS. 20A-20D, a fiber bundle 208 may be formed from canes 132 that each include a respective group of fibers 82. In some cases, each cane in fiber bundle 208 may be the same (e.g., formed using the same process and having the same initial structure in the bundle). However, in some cases it may be desirable for different canes 132 in coherent fiber bundle 208 to have different properties. For example, the canes may include fibers with different pitches, may have fibers with different diameters, may include fibers having different tensile stresses, may include fibers with different expansion ratios, may include fibers with different compression ratios, may include fibers with different taper ratios, may have different types and/or amounts of filler materials (e.g., cladding 86 or binder 88), etc.

The tensile stress of each cane is one example of a property that may vary in different canes in a fiber bundle. During swelling (e.g., when the fibers expand into an opening as shown in FIG. 22), the fibers at the edges of the bundle that are forced into the opening may release stress (reducing their tensile stress). The fibers at the center of the bundle that are not forced into the opening may not experience the same reduction in tensile stress. Therefore, if all of the canes started with the same tensile stress, the tensile stress of the canes at the edge of the fiber bundle would end up having a lower tensile stress than the canes at the center of the fiber bundle. To prevent this, the canes at the edge of the fiber bundle may begin with a higher tensile stress than the canes at the center of the fiber bundle.

Figure 31:
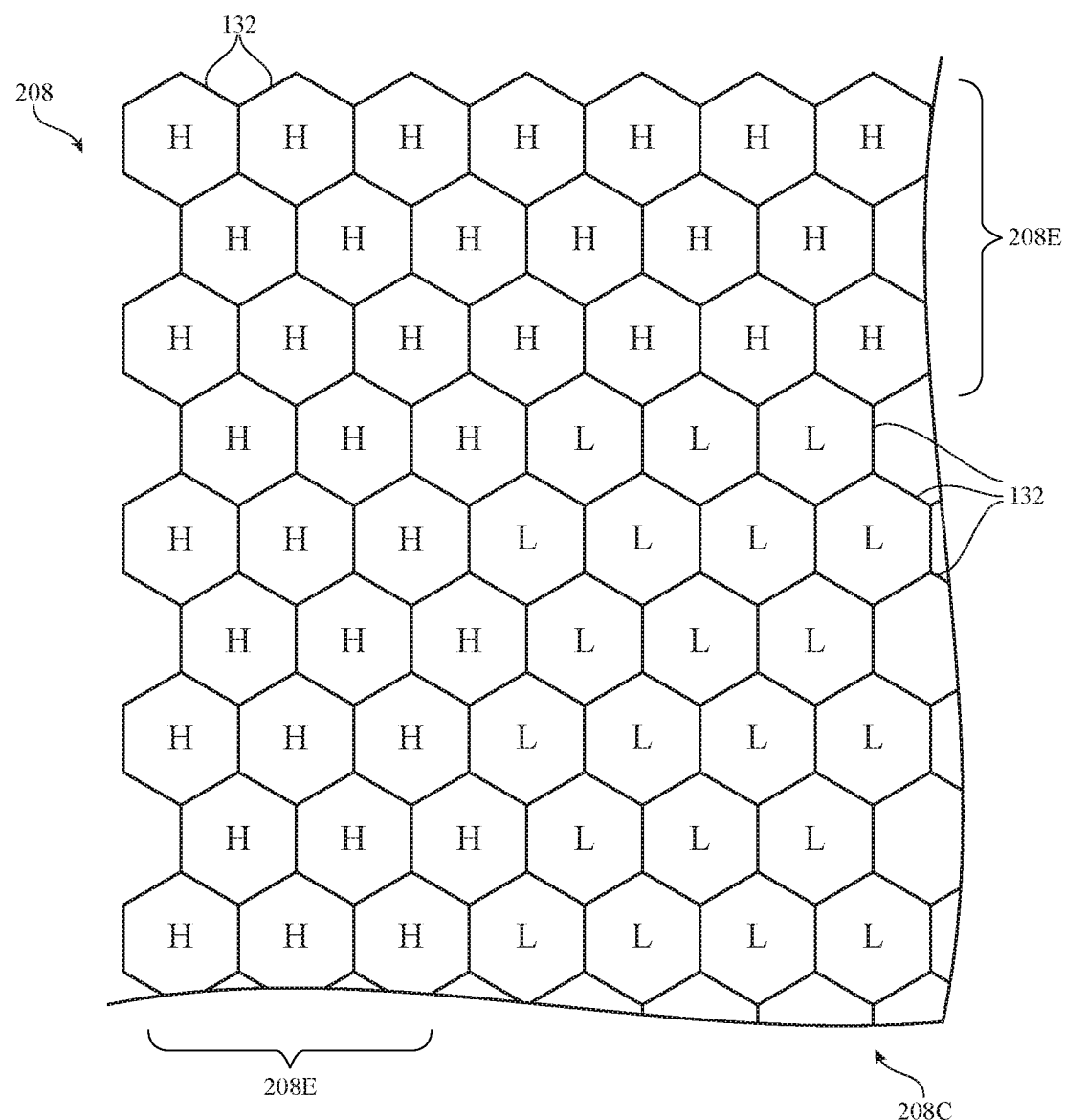
FIG. 31 is a top view of an illustrative fiber bundle with fibers having different properties in different portions of the bundle in accordance with an embodiment.

Tensile stress in a cane may be increased by drawing the cane with a greater amount of force (e.g., in directions 134 and 136 of FIG. 20C). The temperature to which the cane is heated during stretching may also affect the tensile stress of the cane. The higher tensile stress canes may then be positioned at the edges of the bundle. When the canes at the edge of the bundle undergo a reduction of tensile stress during swelling, the ultimate tensile stress of the edge canes will match the tensile stress of the center canes. FIG. 31 is a top view of an illustrative fiber bundle 208 that includes canes having different tensile stress levels. As shown, canes 132 in edge portion 208E of the fiber bundle may have a higher tensile stress than canes 132 in central portion 208C of the fiber bundle. The canes with the higher tensile stress are labeled 'H' and the canes with the lower tensile stress are labeled 'L.' The example of FIG. 31 is merely illustrative and the canes may have tensile stresses that are uniform or that vary in any desired pattern.

In some cases, it may be desirable for portions of the fiber bundle to be formed from light absorbing material (e.g., to control viewing angle of the display, to control contrast, to hide defects in the display, etc.). The light absorbing material may sometimes be referred to as an electromagnetic absorber (EMA). The light absorbing material may be incorporated into the cladding of a fiber (e.g., cladding 86 in FIG. 5) or may be incorporated as a filler material between fibers (e.g., filler 88 in FIG. 5). Different canes of fibers in a fiber bundle may have different amounts of light absorbing material. For example, all of the fibers in one cane may have light absorbing material as cladding whereas none of the fibers in another cane may have light absorbing material as cladding. In another example, a certain percentage of fibers (e.g., 1%) of fibers in one cane may have light absorbing material as cladding whereas none of the fibers in another cane may have light absorbing material as cladding. To summarize, different canes may be formed with different amounts of light absorbing material if desired. The light absorbing material may be a black material that absorbs visible light.

In some cases, a fiber may be color filtering. In other words, the fiber may only pass light of a particular color (e.g., red, green, or blue). The fibers may include Bragg gratings that act as a notch filter for light of the desired wavelength. The fibers may also include a light absorbing material that absorbs light at colors other than the color to be emitted. For example, a fiber configured to emit red light may include a green light absorbing material and a blue light absorbing material. The fiber may also include fluorescent dye for modifying the color of light emitted from the fiber. In general, each fiber may be formed to have any desired color filtering effect.

The fibers may be varied to control the viewing angle of the display. When there is a small difference in refractive index between the core of a fiber and the cladding of a fiber, the associated viewing angle will be small. When there is a larger difference in refractive index between the core of a fiber and the cladding of a fiber, the associated viewing angle will be larger. The refractive index difference of each fiber may vary on a per-fiber basis or on a per-cane basis if desired.

Figure 32:
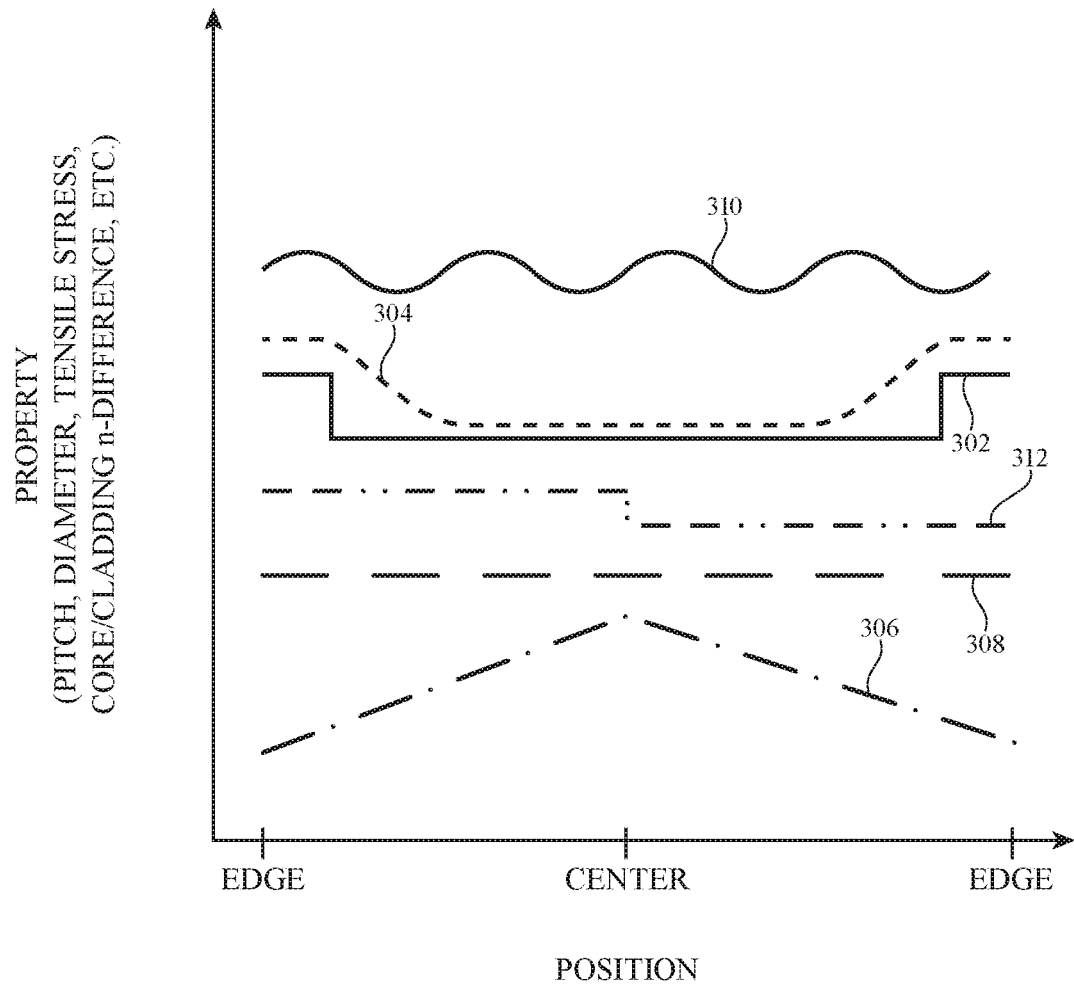
FIG. 32 is a graph of illustrative profiles showing how a property of a fiber may vary based on the position of the fiber within the fiber bundle in accordance with an embodiment.

FIG. 32 is a graph showing how the properties of fibers may optionally vary as a function of position within the fiber bundle. In other words, the properties of the fibers may vary laterally across the image transport layer. Any property of the fiber (e.g., pitch, diameter, tensile stress, compression ratio, taper ratio, expansion ratio, input angle, output angle, refractive index difference between cladding and core, rigidity, Young's modulus, etc.) may follow any desired profile. Each of these properties may be considered one or more of a physical property (e.g., pitch, diameter, Young's modulus, compression ratio, taper ratio, expansion ratio, etc.), an optical property (e.g., refractive index difference between cladding and core, transmissivity), and a stress property (e.g., tensile stress, rigidity, Young's modulus, etc.). FIG. 32 shows how the profile (e.g., profile 302) may be at a maximum at the edges and transition step-wise to a lower amount in a central portion. The property may instead vary gradually between the edges and central portion as in profile 304. This example of the property being higher in the edges than the center is merely illustrative. The property may instead be higher in the center than the edges as with profile 306 or the property may be uniform across the bundle as with profile 308. The property may vary continuously across the bundle as in profile 310. The property also need not have a profile that has an axis of symmetric through the center of the bundle. The property may have an asymmetrical profile as shown by profile 312. For all of these examples of how a property may vary, the property may vary on a per-fiber basis (with each adjacent fiber optionally having a different value for the property) or on a per-cane basis (with all fibers in each cane having the same value for the property but the fibers in different canes optionally having a different value for the property). In all of these profiles, any changes may be step-wise (as in 302) or may be gradual (as in 304).

The profiles in FIG. 32 may depict the variation of a desired property for the fibers across any desired portion of the image transport layer. For example, the property may vary between the left and right edges of the image transport layer, between the upper and lower edges of the image transport layer, or between opposing corners of the image transport layer. In general, the profiles in FIG. 32 may depict variation across any desired cross-section of the image transport layer.

Figure 33:
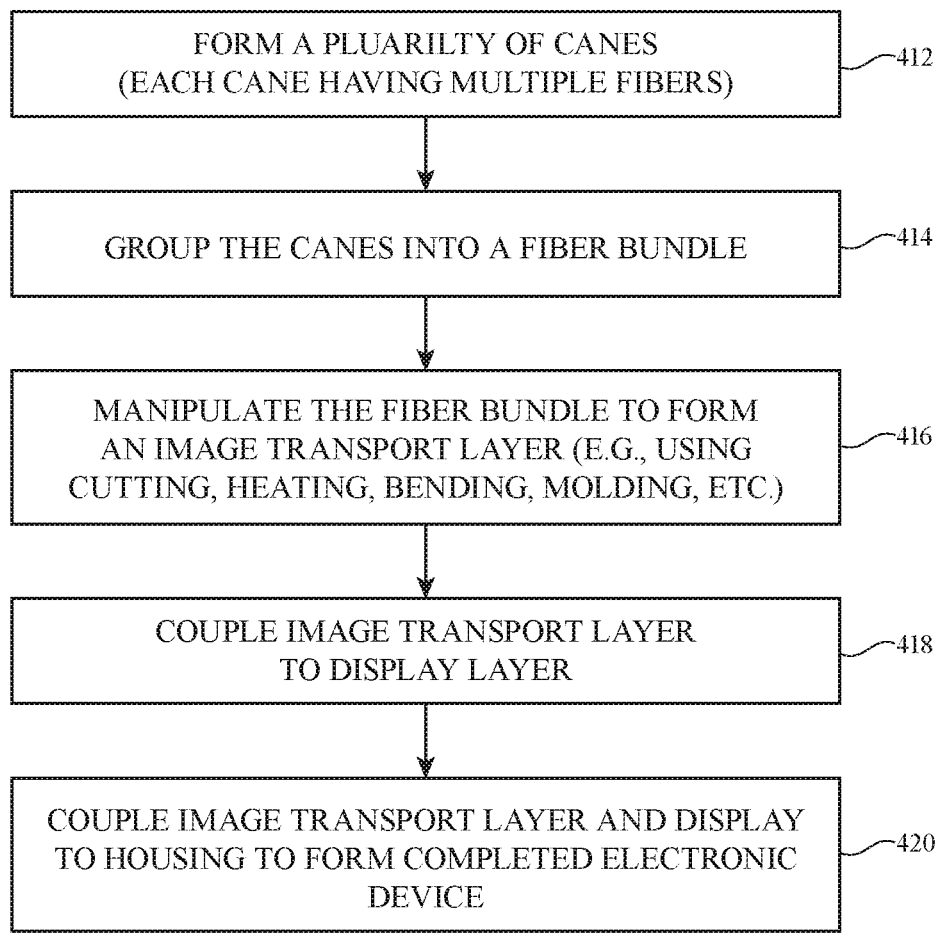
FIG. 33 is a flowchart of illustrative method steps for forming an electronic device that includes an image transport layer in accordance with an embodiment.

FIG. 33 is a flowchart of illustrative method steps for forming an electronic device with an image transport layer. First, at step 412, a plurality of canes may be formed. Each cane may include multiple fibers. The canes may have a hexagonal cross-sectional shape as shown in FIG. 20C or may have another desired shape. Next, at step 414, the canes may be grouped together into a fiber bundle. Each cane may have one or more unique properties or there may be properties that vary on a per-fiber basis.

Once the canes are arranged in a group of fibers (e.g., a fiber bundle), the group of fibers may be manipulated (processed) to form an image transport layer at step 416. For example, the group of fibers may be cut, heated, bent, molded, etc. In one illustrative example, the group of fiber bundles may be molded by applying heat and pressure, causing fibers in the group of fibers to expand into a recess. The image transport layer may then be cut from the molded group of fibers. In another illustrative example, the group of fibers may be stamped by a stamping tool (e.g., in a continuous process). One or more image transport layers may then be cut from the stamped group of fibers. In yet another illustrative example, the group of fibers may be cut to have parallel, unbent fibers of varying length (e.g., as in FIG. 27). The group of fibers may then be bent (while optionally also being heated). An image transport layer may then be cut from the group of fibers. In yet another illustrative example, the group of fibers may initially have parallel, unbent fibers of uniform length (e.g., as in FIG. 29). The group of fibers may then be bent (while also being heated). The group of fibers may be pressed to conform to a mold (e.g., by gravity or a bias force). An image transport layer may then be cut from the group of fibers.

After being cut from the group of fibers, one or more polishing steps may be performed on the image transport layer. In one illustrative example, there may be two polishing processes performed. The first polishing step may be a rough polish and the second polishing step may be a fine polish. Before and after each polishing step, the image transport layer may be cleaned using ultrasonic cleaning. Therefore, when two polishing steps are performed, three cleaning steps may be performed. After the polishing and cleaning steps are performed, the image transport layer may have a roughness parameter Ra (an arithmetical mean deviation of the roughness profile) that is less than 20 nanometers.

Once the image transport layer is formed, the image transport layer may be coupled to a display layer at step 418. Then, at step 420, the image transport layer and display layer may be coupled to an electronic device housing (e.g., housing 12 in FIG. 2) to form a completed electronic device. The examples of steps 418 and 420 are merely illustrative. It should be understood that the image transport layer may be incorporated into an electronic device at any desired point in the manufacturing process. For example, the image transport layer may alternatively be coupled to a cover glass, then the image transport layer and cover glass may be incorporated into the electronic device. In another example, the image transport layer may be manipulated or formed while already coupled to the display layer. In general, any desired steps may be taken to incorporate the image transport layer formed in step 416 into a completed electronic device.

In some cases, image transport layer 80 may serve as the outermost structure of device 10 (e.g., output surface 92 of image transport layer 80 may form an exterior surface of the electronic device). In these types of arrangements, the image transport layer may be strengthened (e.g., by a chemical treatment, heat treatment, etc.) during the manufacturing process (e.g., after step 416 in FIG. 33). Chemical strengthening may be performed by placing a glass image transport layer in a heated potassium salt bath to perform an ion-exchange process. Chemical strengthening in this way may enhance the compressive stress of the outermost surfaces of the glass image transport layer relative to deeper portions. Heat treatment (e.g., thermal tempering) may also be used to create compressive stress on outer surfaces of image transport layer 80. By creating compressive stress on the surface of image transport layer 80, the strength of output surface 92 may be enhanced. If desired, an antiscratch coating, an antireflection coating, an antismudge coating, and/or other exterior coating layers may be applied to surface 92.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
   an array of pixels configured to display an image;
   an image transport layer that has an input surface and an opposing curved output surface, wherein the input surface receives the image, and wherein:
     the image transport layer transports the image from the input surface to the curved output surface, and
     the image transport layer comprises fibers that each have a first end at the input surface, that each have a second end that forms part of the curved output surface, and that each have first and second bends between the first end and the second end of that fiber, wherein each of the fibers has a longitudinal axis that extends along a respective length of that fiber, each longitudinal axis is at a first angle relative to the array of pixels at the input surface and is at a second angle relative to the array of pixels at the curved output surface, and the second angle is within twenty degrees of the first angle; and
   a curved cover layer that overlaps the image transport layer.

2. The electronic device defined in claim 1, wherein the array of pixels is formed on a display layer, wherein the display layer includes an inactive border region that surrounds the array of pixels, wherein the first end of each of the fibers overlaps the array of pixels, and wherein the fibers extend over the inactive border region.

3. The electronic device defined in claim 1, wherein each of the fibers has an output angle that is defined as an angle between the longitudinal axis and the array of pixels at the curved output surface, wherein the image transport layer has a first portion and a second portion that laterally surrounds the first portion, wherein the output angle of each fiber in the first portion is greater than 88°, and wherein the output angles of the fibers in the second portion decrease as the fibers approach an edge of the image transport layer.

4. The electronic device defined in claim 1, wherein each of the fibers has a core with a first refractive index and a cladding with a second refractive index that is lower than the first refractive index.

5. The electronic device defined in claim 1, wherein a distance between the input surface of the image transport layer and the array of pixels is less than 100 microns.

6. The electronic device defined in claim 1, wherein the curved output surface comprises a planar central portion and a curved edge portion that extends in a ring around the planar central portion.

7. An electronic device comprising:
   an array of pixels configured to display an image;
   an image transport layer that has an input surface and an opposing curved output surface, wherein the input surface receives the image, wherein the image transport layer transports the image from the input surface to the curved output surface, and wherein the image transport layer comprises fibers that each have a first end at the input surface, that each have a second end that forms part of the curved output surface, and that each have first and second bends between the first end and the second end of that fiber, wherein the image transport layer has a thickness that is less than 2.0 millimeters, wherein the image transport layer includes at least one fiber that laterally translates light by a distance that is greater than 1.5 millimeters between the input surface and the curved output surface, wherein every fiber in the image transport layer has an expansion ratio less than 1.3, wherein every fiber in the image transport layer has a compression ratio less than 1.9, and wherein every fiber in the image transport layer has a taper ratio less than 2.2; and
   a curved cover layer that overlaps the image transport layer.

8. The electronic device defined in claim 7, wherein the array of pixels is formed on a display layer, wherein the display layer includes an inactive border region that surrounds the array of pixels, wherein the first end of each of the fibers overlaps the array of pixels, and wherein the fibers extend over the inactive border region.

9. The electronic device defined in claim 7, wherein each of the fibers has a longitudinal axis that extends along a respective length of that fiber, wherein each longitudinal axis is at a first angle relative to the array of pixels at the input surface and is at a second angle relative to the array of pixels at the curved output surface, and wherein the second angle is within twenty degrees of the first angle.

10. The electronic device defined in claim 7, wherein each of the fibers has a longitudinal axis that extends along a respective length of that fiber, wherein each of the fibers has an output angle that is defined as an angle between the longitudinal axis and the array of pixels at the curved output surface, wherein the image transport layer has a first portion and a second portion that laterally surrounds the first portion, wherein the output angle of each fiber in the first portion is greater than 88°, and wherein the output angles of the fibers in the second portion decrease as the fibers approach an edge of the image transport layer.

11. The electronic device defined in claim 7, wherein each of the fibers has a core with a first refractive index and a cladding with a second refractive index that is lower than the first refractive index.

12. The electronic device defined in claim 7, wherein a distance between the input surface of the image transport layer and the array of pixels is less than 100 microns.

13. The electronic device defined in claim 7, wherein the curved output surface comprises a planar central portion and a curved edge portion that extends in a ring around the planar central portion.

\* \* \* \* \*